(12) United States Patent
Rogers et al.

(10) Patent No.: US 9,530,613 B2
(45) Date of Patent: Dec. 27, 2016

(54) FOCUSING A CHARGED PARTICLE SYSTEM

(75) Inventors: Steven R. Rogers, D.N. Emek Sorek (IL); Rainer K. Knippelmeyer, Aalen (DE); Thomas Kemen, Aalen (DE); Stefan Schubert, Oberkochen (DE); Nissim Elmaliah, Raanana (IL)

(73) Assignees: Applied Materials Israel, Ltd., Rehovot (IL); Carl Zeiss Microscopy GmbH, Jena (DE)

( * ) Notice: Subject to any disclaimer, the term of this patent is extended or adjusted under 35 U.S.C. 154(b) by 699 days.

(21) Appl. No.: 14/000,213

(22) PCT Filed: Feb. 17, 2012

(86) PCT No.: PCT/US2012/025656
§ 371 (c)(1),
(2), (4) Date: Mar. 24, 2015

(87) PCT Pub. No.: WO2012/112894
PCT Pub. Date: Aug. 23, 2012

(65) Prior Publication Data
US 2015/0287568 A1    Oct. 8, 2015

Related U.S. Application Data

(60) Provisional application No. 61/444,506, filed on Feb. 18, 2011.

(51) Int. Cl.
*G01N 23/00* (2006.01)
*H01J 37/21* (2006.01)
(Continued)

(52) U.S. Cl.
CPC ............... *H01J 37/21* (2013.01); *H01J 37/06* (2013.01); *H01J 37/09* (2013.01); *H01J 37/153* (2013.01); *H01J 37/22* (2013.01); *H01J 37/222* (2013.01); *H01J 37/244* (2013.01); *H01J 37/261* (2013.01); *H01J 37/28* (2013.01); *H01J 37/29* (2013.01); *H01J 2237/049* (2013.01);
(Continued)

(58) Field of Classification Search
None
See application file for complete search history.

(56) References Cited

U.S. PATENT DOCUMENTS 7,005,659 B2 * 2/2006 Muraki ................. B82Y 10/00
                                                      250/396 R
7,065,240 B2 * 6/2006 Tada .................... G01N 21/956
                                                      250/201.2
(Continued)

*Primary Examiner* — Andrew Smyth
(74) *Attorney, Agent, or Firm* — Lowenstein Sandler LLP

(57) ABSTRACT

A charged particle beam focusing apparatus includes a charged particle beam generator configured to project simultaneously at least one non-astigmatic charged particle beam and at least one astigmatic charged particle beam onto locations on a surface of a specimen, thereby causing released electrons to be emitted from the locations. The apparatus also includes an imaging detector configured to receive the released electrons from the locations and to form images of the locations from the released electrons. A processor analyzes the image produced by the at least one astigmatic charged particle beam and in response thereto adjusts a focus of the at least one non-astigmatic charged particle beam.

20 Claims, 17 Drawing Sheets

(51) Int. Cl.
  *H01J 37/09*    (2006.01)
  *H01J 37/153*   (2006.01)
  *H01J 37/22*    (2006.01)
  *H01J 37/28*    (2006.01)
  *H01J 37/29*    (2006.01)
  *H01J 37/26*    (2006.01)
  *H01J 37/06*    (2006.01)
  *H01J 37/244*   (2006.01)

(52) U.S. Cl.
  CPC . *H01J 2237/0453* (2013.01); *H01J 2237/063* (2013.01); *H01J 2237/1532* (2013.01); *H01J 2237/21* (2013.01); *H01J 2237/2817* (2013.01)

(56) References Cited

U.S. PATENT DOCUMENTS

| | | | | |
|---|---|---|---|---|
| 7,244,949 B2 * | 7/2007 | Knippelmeyer | ....... | B82Y 10/00 250/310 |
| 7,253,417 B2 * | 8/2007 | Frosien | ................. | B82Y 10/00 250/306 |
| 2005/0029473 A1 * | 2/2005 | Muraki | ................. | B82Y 10/00 250/492.1 |
| 2010/0072387 A1 * | 3/2010 | Sawada | ................. | H01J 37/153 250/396 ML |

* cited by examiner

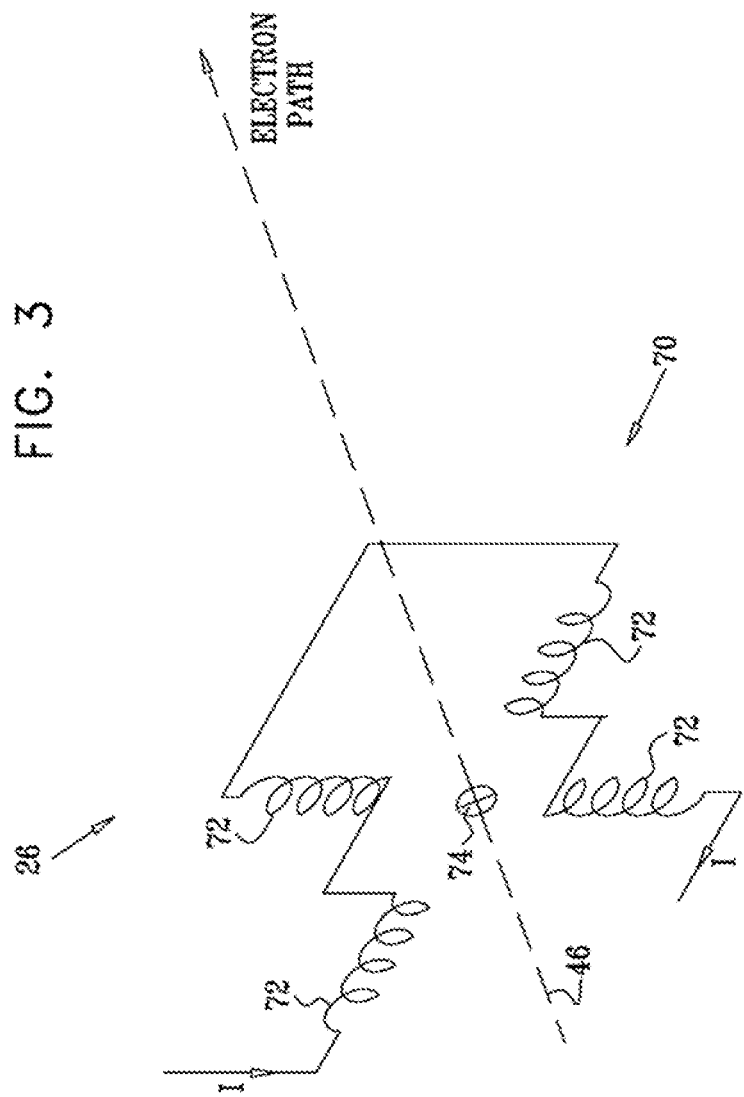

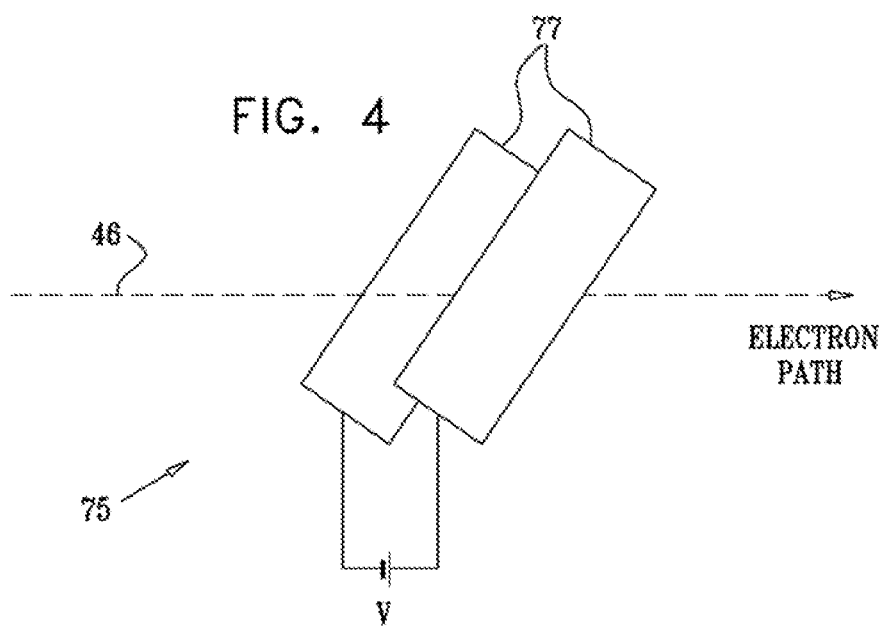
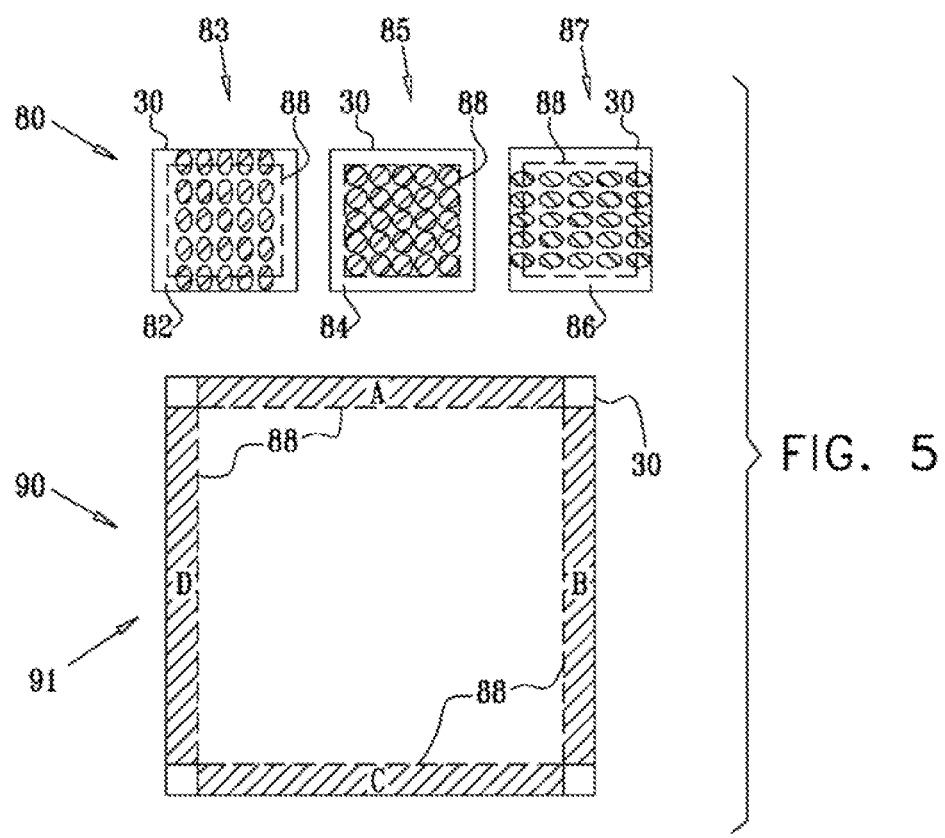

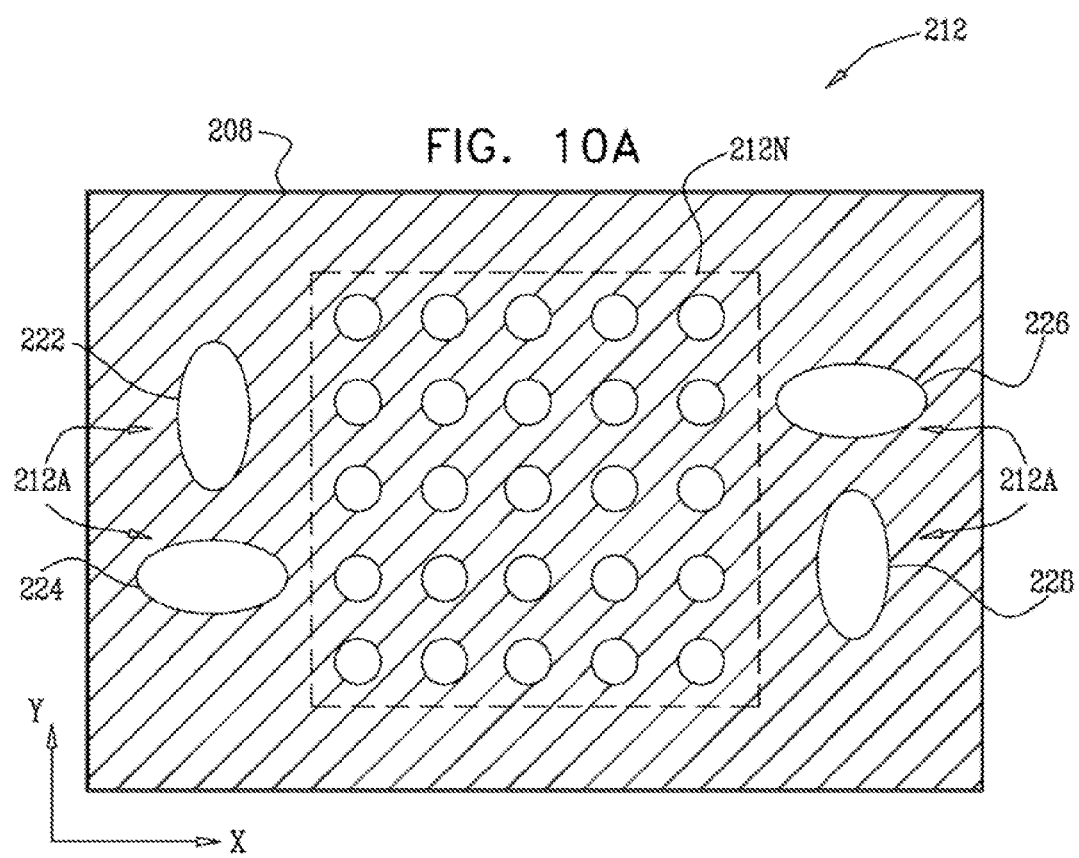

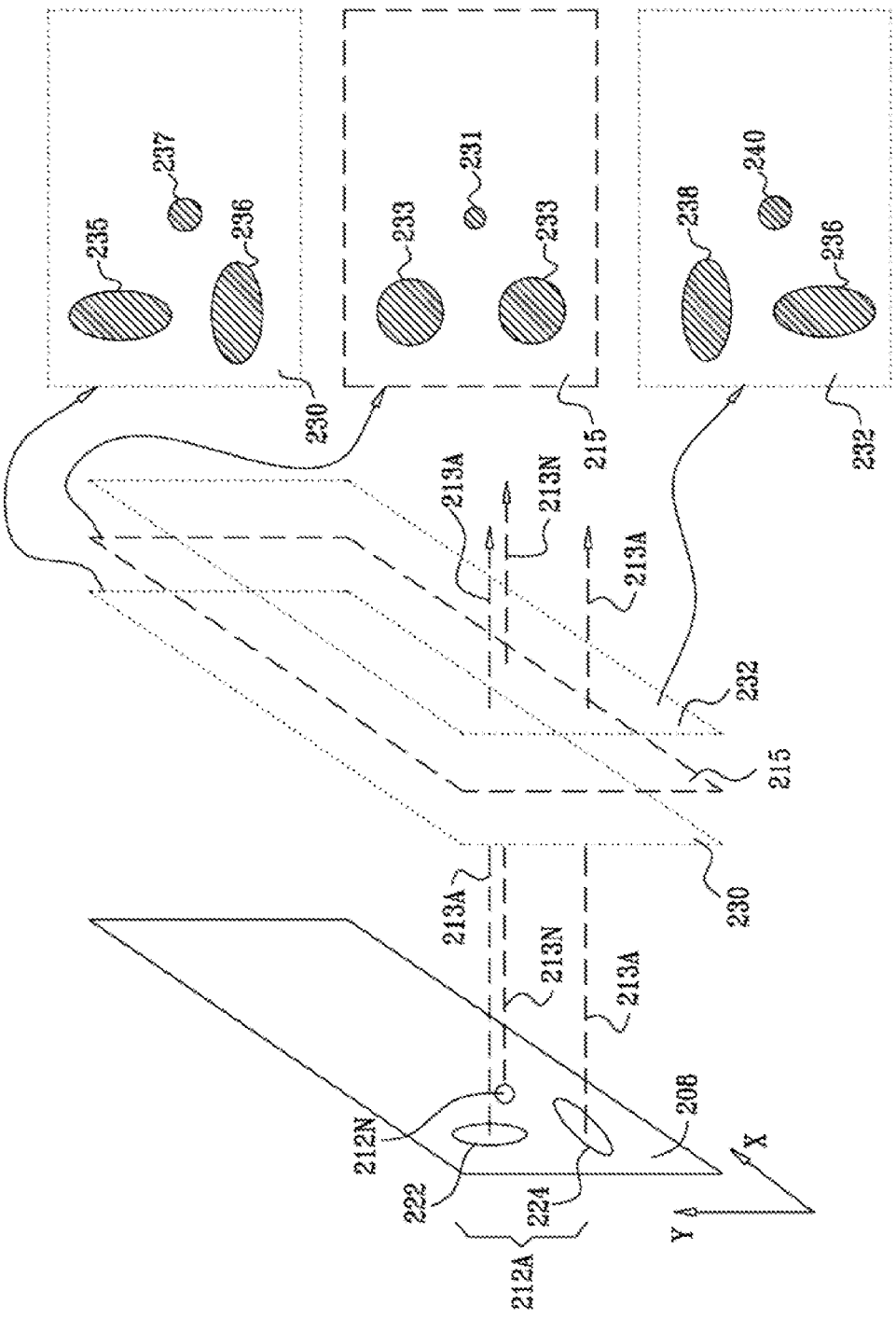

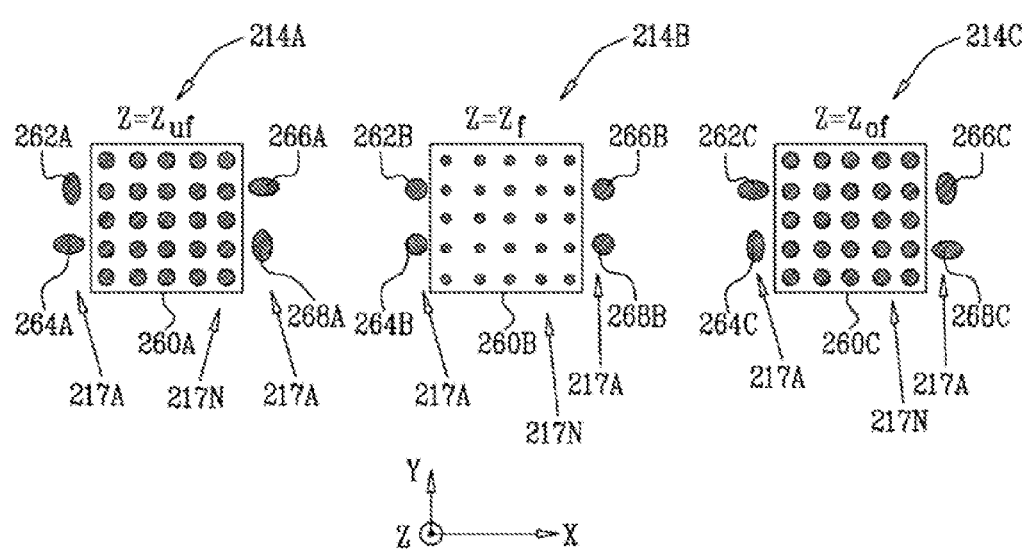
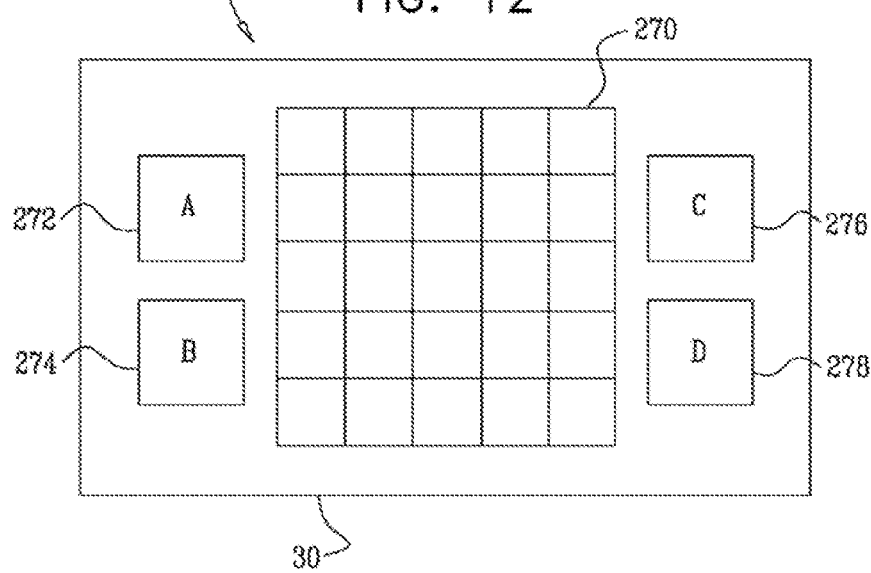

FOCUSING A CHARGED PARTICLE SYSTEM

RELATED APPLICATIONS

This application claims priority to and incorporates by reference U.S. Provisional Patent Application 61/444,506, filed 18 Feb. 2011.

FIELD OF THE INVENTION

The present invention relates generally to focusing systems, and specifically to focusing charged particle beams.

BACKGROUND OF THE INVENTION

Charged particle beams, such as those that are used in focused ion beam or scanning electron microscopes, are typically focused by scanning the beam over a sample with sharp edges. The incident charged beam generates a scanned image of the sample, and the beam is focused by maximizing the contrast of the scanned image. However, this focusing system requires a patterned sample with sharp features.

The same method of scanning and maximizing contrast in the scanned image may also be used in wide area particle beam systems used for electron beam inspection and lithography. In these systems, in addition to the requirement for the patterned sample, this focusing method interrupts the normal wide area operation, and the scanning of the beam over the sample may introduce charging artifacts.

Other methods for focusing electron beams are known in the art. For example, U.S. Pat. No. 5,483,036, to Giedt, et al., whose disclosure is incorporated herein by reference, describes a method for automatically focusing an electron beam by determining the beam size. The beam is swept over a number of narrow slits, and the current profiles generated as the beam sweeps are used to find the beam size, and to focus the beam to an optimal position.

U.S. Pat. No. 5,726,919, to Azad, et al., whose disclosure is incorporated herein by reference, describes a system for measuring the effective focus of an electron beam. The electron beam generates a temperature profile of an irradiated target, and the temperature profile is measured optically. Beam focus operating parameters are varied until an error between the measured temperature profile and a predicted profile for an effective focus are less than a predetermined value.

In charged particle systems, astigmatism is considered a problem, and much effort has been expended to reduce the problem. For example, U.S. Patent Application 2003/0201393, to Tsuneta et al., whose disclosure is incorporated herein by reference, is directed to improving performance of an electron microscope. The disclosure describes a stigmator that is used as a compensator for astigmatic aberration, currents through the stigmator being adjusted to reduce the astigmatism of the electron microscope to zero.

U.S. Pat. No. 6,559,456, to Muraki, whose disclosure is incorporated herein by reference, describes an electron beam system. The system uses a dynamic stigmatic coil in the incoming beam path to set the astigmatism of the irradiating electron beam to be substantially equal to zero, by adjusting the blur of the focused beam to be equal in two orthogonal directions.

U.S. Pat. No. 6,025,600, to Archie et al., whose disclosure is incorporated herein by reference, and PCT application WO 03/041109, to Almogy et al., whose disclosure is incorporated herein by reference, describe charged particle beam systems.

SUMMARY OF THE INVENTION

In an embodiment of the present invention, a charged particle beam generator, typically an electron beam generator operating in an electron microscope, generates two types of beams simultaneously. A first type of beam has astigmatism incorporated in the beam, and is herein termed an astigmatic charged particle beam. A second type of beam is substantially aberration-free, and does not have astigmatism incorporated in the beam. The second type is herein termed a non-astigmatic charged particle beam. The generator projects one or more of each type of beam simultaneously through an irradiation system onto a surface of a specimen being examined, which is typically a semiconducting wafer. The incident beams on the surface cause released electrons to be emitted from locations of the surface whereat the beams impinge.

The released electrons are received by an imaging detector, which forms images of the locations from the electrons. The locations irradiated by the astigmatic charged particle beams are in general ellipses. A processor analyzes the elliptical images of the locations irradiated by the astigmatic charged particle beams to determine a focus metric, and the processor uses the metric to adjust the focus of the non-astigmatic charged particle beams. Images generated by the latter are typically used by the processor in examining the specimen. By using the two types of beams simultaneously, and by projecting the beams through a common irradiation system, focusing of the beams examining the specimen is accomplished without introducing aberrations into the examining beams. In addition, the focusing is achieved even in the presence of spurious changes in the irradiation system, as well as in the presence of local charging on the surface being examined.

In some embodiments of the present invention, the images produced by the astigmatic charged particle beams are selected to be from regions of the surface that have features having the same directions as one of the axes of the ellipses formed by the astigmatic charged particle beams on the surface. By using such features, the focus metric is enhanced.

Typically, the examining beams are generated as an array of beams, and the one or more astigmatic charged particle beams surround the array. By having the latter beams outside the array, any charging artifacts introduced by the astigmatic charged particle beams are outside the region of interest, i.e., the region being examined by the examining beams.

The present invention will be more fully understood from the following detailed description of the embodiments thereof, taken together with the drawings, a brief description of which follows.

BRIEF DESCRIPTION OF THE DRAWINGS

FIG. 3 is a schematic illustration of an aberrating element used in the system of FIG. 1, according to an embodiment of the present invention;

FIG. 4 is a schematic illustration of an aberrating element used in the system of FIG. 1, according to an alternative embodiment of the present invention;

FIG. 5 shows schematic illustrations of images formed by an imager in the system of FIG. 1, according to an embodiment of the present invention;

FIG. 10A is a schematic diagram of a multi-aperture array element, according to an embodiment of the present invention;

FIG. 10B is a schematic diagram of electron beam cross-sections formed by beams from apertures of the element of FIG. 10A, according to an embodiment of the present invention;

FIG. 11 shows schematic diagrams of an array imaged on the surface of a specimen, according to an embodiment of the present invention;

FIG. 12 is a schematic diagram showing regions of an imager, according to an embodiment of the present invention;

DETAILED DESCRIPTION

Figure 1:
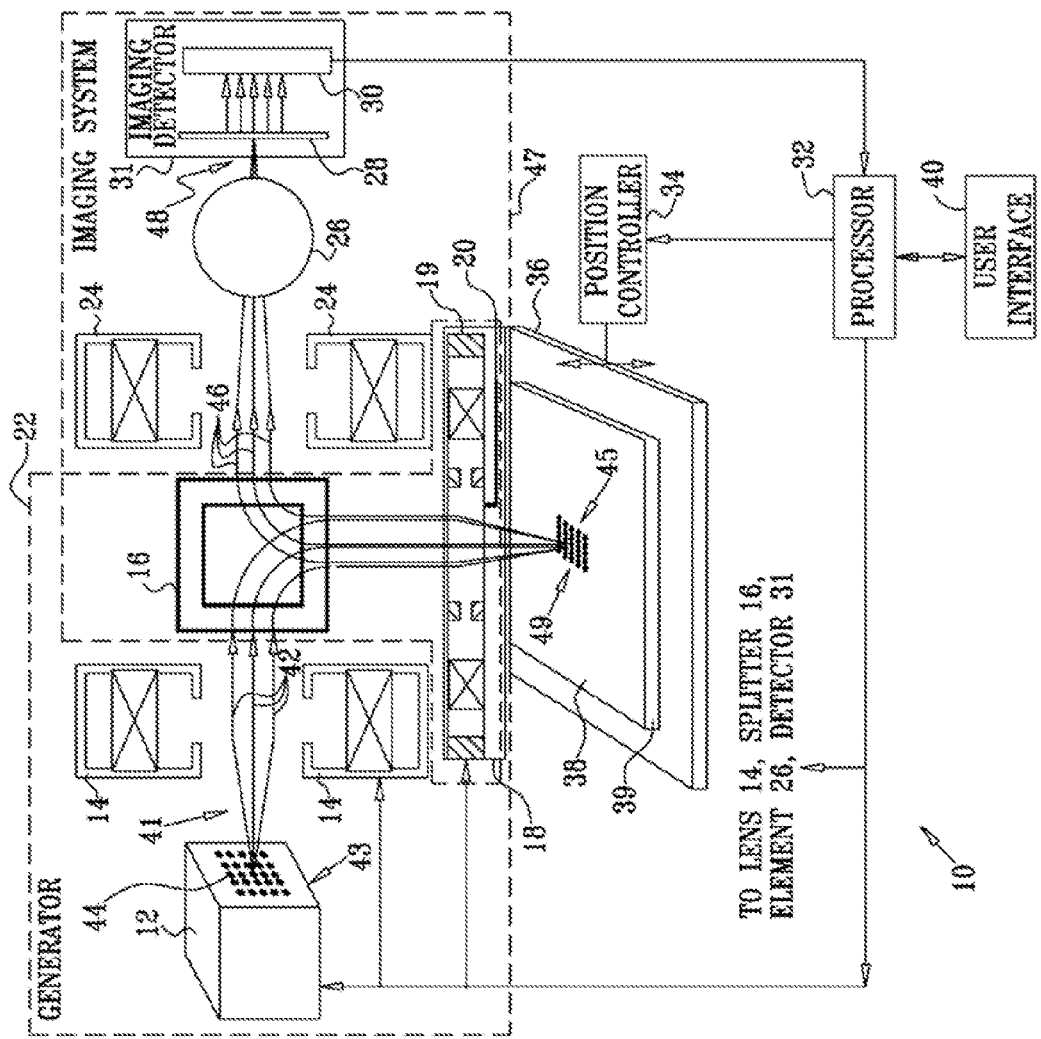
FIG. 1 is a schematic diagram of a charged particle beam focusing system, according to an embodiment of the present invention.

Reference is now made to FIG. 1, which is a schematic diagram of a charged particle beam focusing system 10, according to an embodiment of the present invention. System 10 includes a charged particle beam generator 22. By way of example, generator 22 is assumed to generate multiple charged particle beams 41 in parallel from a spot grid array (SGA) 44, and herein below the multiple beams are assumed to comprise multiple electron beams, generated by a charged particle gun 12, which is herein assumed to be a multiple electron beam gun. By way of example, except where otherwise stated it is assumed that array 44 is a generally rectangular array aligned with horizontal and vertical axes. It will be appreciated, however, that the scope of the present invention is not limited to a particular type or alignment of SGA 44, and includes substantially all types and alignments of such arrays.

It will also be appreciated that the scope of the present invention is not limited to focusing a particular type of charged particle, and includes substantially all types of charged particles, including ions such as Gallium or other metallic ions. Furthermore, while the description herein below is drawn to a multiple source charged particle system by way of example, it will be understood that the principles of the present invention apply to focusing charged particles from a single source.

Generator 22 comprises one or more illumination lenses 14, a beam splitter 16, and an objective lens 18. Typically, the one or more lenses 14 and beam splitter 16 operate magnetically, although the lenses and/or the beam splitter may also incorporate other types of operation, such as electrostatic operation. For example, beam splitter 16 may comprise a Wien filter. Objective lens 18 may advantageously be a retarding lens, comprised of a magnetic portion 19 and an electrostatic portion 20.

Particle gun 12 generates the multiple electron beams of SGA 44 from respective substantially circular sources 43, each of the beams following irradiation paths 42 through generator 22 to a surface 38 of a specimen 39, which is mounted on a movable stage 36. For clarity, an irradiation path 42 from only one source 43 is illustrated in FIG. 1, but it will be understood that generally similar irradiation paths 42 are followed by the electron beams from the other originating sources 43 of SGA 44. The one or more lenses 14, beam splitter 16, and objective lens 18 form respective generally circular images 45, herein below referred to as spots 45, of sources 43 on surface 38. Individual spots 45 are contained within an array 49, which is an image of SGA 44 formed on surface 38.

Each spot 45 generates reflected, secondary, and/or back-scattered electrons, and these electrons, which in this specification and in the claims are also termed released electrons, pass through objective lens 18, and beam splitter 16. The released electrons from each spot 45 follow imaging paths 46, via an imaging lens 24 and an aberrating element 26, to an electron detector 28. For clarity, an imaging path 46 from only one spot 45 is illustrated in FIG. 1, but it will be understood that generally similar imaging paths 46 are followed by the released electrons from the other spots 45.

Electron detector 28, typically a phosphor screen comprised of a scintillator crystal or a granulated scintillator powder, converts the released electrons to optical radiation, which is imaged by an imager 30, such as a charge coupled detector (CCD) array. Detector 28 and imager 30 are typically combined as one unit, and act as an imaging detector 31 of the released electrons. Alternatively, imaging detector 31 may comprise an avalanche photodiode array, which directly detects the released electrons without conversion to light. Typically, the axes of imager 30 align with those of array 44. Lenses 18 and 24, beam splitter 16, aberrating element 26, and imaging detector 31 comprise an imaging system 47 for system 10. The image generated by imaging system 47 is transferred to a processor 32, which analyzes the image. As described in more detail below, in response to the analysis, processor 32 adjusts the focus of spots 45 to be optimal.

Processor 32 is coupled to gun 12, lenses 14, beam splitter 16, objective lens 18, imaging lens 24, aberrating element 26, and imaging detector 31, so as to control their operation, and to act as an overall controller of system 10. For example, processor 32 may adjust the excitation of magnetic portion 19 of lens 18, and/or the energy of the beam output from generator 22. Typically, processor 32 receives operating parameters from an operator of the system via a user interface 40, which enables the operator to adjust settings of the system components described above, as well as other components of system 10 described below. Processor 32 is also coupled to, and operates, a position controller 34. Under command of the processor, controller 34 is able to adjust stage 36 in a vertical direction.

Aberrating element 26 introduces an aberration into the images of spots 45 produced by imaging system 47, the distorted images typically being formed in a region 48 after the element. The aberration typically comprises an astigmatism, so that each spot 45 is imaged in two different focal planes orthogonal to the path of the electrons, each plane comprising a different ellipse to which the released electrons are focused.

Figure 2:
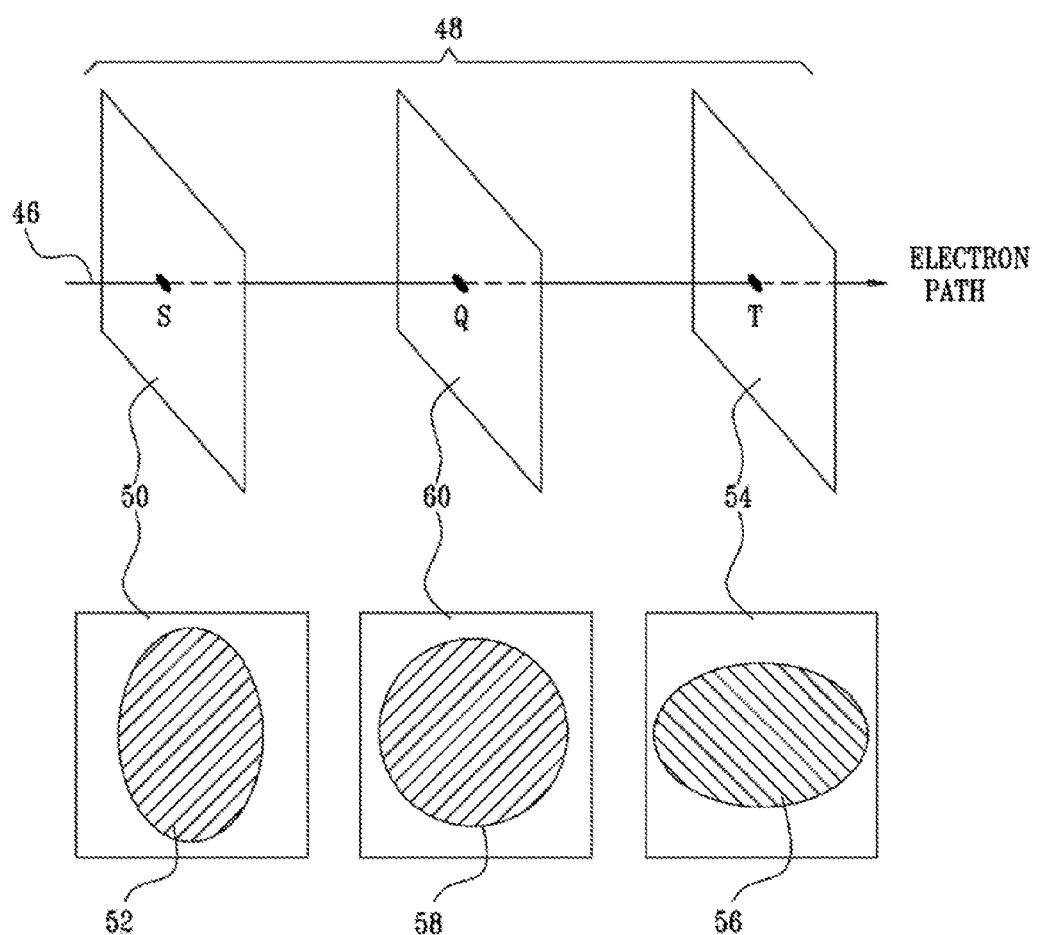
FIG. 2 is a schematic illustration of the effects of introducing astigmatism into an imaging path of electrons released from the system of FIG. 1, according to an embodiment of the present invention.

FIG. 2 is a schematic illustration of the effects of introducing astigmatism into imaging path 46 of the released electrons, according to an embodiment of the present invention. For clarity, neither aberrating element 26 nor detector 28 are shown in FIG. 2, which illustrates images formed in region 48, and respective positions of the images in the region, from one of spots 45. Aberrating element 26 focuses the released electrons to a first focal plane 50, forming a first elliptical image 52 in the plane, which is at a position S in path 46. The electrons continue to a second focal plane 54, wherein the released electrons form a second elliptical image 56. Plane 54 is at a position T in path 46. The two elliptical images have major axes which are orthogonal to each other, and the axes are herein assumed to be generally vertical and horizontal. Distance ST provides a metric of the aberration introduced into system 10 by element 26, and other metrics that may be used to quantify a size of the aberration will be apparent to those skilled in the art. Between planes 50 and 54, imaging system 47 images the released electrons to a generally circular image 58, generated in a plane 60 parallel to planes 50 and 54, and positioned at a position Q between S and T.

FIG. 3 is a schematic illustration of aberrating element 26, according to an embodiment of the present invention. Element 26 is formed as a quadrupole lens 70, constructed from four generally similar magnetic coils 72 connected in series, so that a current I flowing through the lens generates four similar poles (four norths or four souths) facing across a center point 74. Quadrupole lenses such as lens 70 are used in the electron microscope art as a stigmator for correcting axial astigmatism present in an electron microscope. In system 10, coils 72 are positioned generally symmetrically about imaging path 46, and processor 32 varies current I flowing through the coils. Increase of current I increases the aberration generated by lens 70.

FIG. 4 is a schematic illustration of aberrating element 26, according to an alternative embodiment of the present invention. In this alternative example of aberrating element 26, the element is formed as a capacitor 75. Ordinarily, capacitor 75 is formed from parallel plates 77, which are aligned so that imaging path 46 makes a non-zero angle with the plane of symmetry of the capacitor. The aberration introduced by capacitor 75 is typically proportional to an electric field generated by a voltage V between plates 77, which can be adjusted by processor 32.

It will be understood that lens 70 and capacitor 75 are examples of aberrating elements that may be used for aberrating element 26, and other systems for producing aberration will be apparent to those skilled in the art. Such systems include, but are not limited to, pluralities of quadrupole lenses and/or capacitors, one or more electrostatic lenses, one or more magnetic lenses other than quadrupole lenses, electrical, magnetic, and electromagnetic devices, as well as combinations and sub-combinations of such lenses and devices. All such systems are assumed to be included within the scope of the present invention.

FIG. 5 shows schematic illustrations of the images formed by imager 30, according to an embodiment of the present invention. Imager 30 forms an array of images, each of which is herein referred to generically as an image 80. Each image 80 corresponds to a respective source 43, and to one of the spots 45. The shape of each image 80 depends, inter alia, on the amount of aberration introduced by element 26, as well as on the position of detector 28 in imaging path 46. Typically, for any specific position of the detector, each image 80 has generally the same shape.

Diagrams 82, 84, and 86 show respective images 83, 85, and 87, of array 49, formed on imager 30 in respective positions S, Q, and T (FIG. 2), and it is assumed for the purposes of example that position Q is the position at which minimal aberration of images 80 occurs. The aberration occurring at other positions, such as positions S and T, may be quantified by using boundaries 88 of the images of diagram 84 as baselines, and finding areas of the images at the other positions which are not bounded by the boundaries. Baseline boundaries 88 have also been drawn on diagrams 82 and 86. A diagram 90 illustrates an arrangement 91 of areas A, B, C, and D, of imager 30 which generate respective signals S(A), S(B), S(C), and S(D). In diagram 82 signals S(A) and S(C) are greater than S(B) and S(D); in diagram 86 signals S(A) and S(C) are less than S(B) and S(D).

An expression for an error signal generated by processor 32, using the areas A, B, C, and D of imager 30, is given by equation (1):

a. $ERR = S(A) + S(C) - S(B) - S(D)$  (1)

b. where ERR represents the value of a focus error signal generated by processor 32, and S(A), S(B), S(C), and S(D) are generated from areas A, B, C, and D respectively.

Applying equation (1) to diagrams 82, 84, and 86, by inspection ERR is respectively positive, approximately zero, and negative. It will be appreciated that there is a direct relation between the magnitude and sign of ERR, the aberration produced at imaging detector 31, and whether spots 45 are "under-focused," in-focus, or "over-focused."

Returning to FIG. 1, processor 32 uses the value of ERR to optimize the focusing of spots 45. Typically, processor 32 adjusts the vertical displacement of stage 36 using controller 34. Alternatively or additionally, the processor adjusts the incoming charged beam, for example by altering a potential applied to gun 12, and/or by altering a current through the one or more lenses 14. Processor 32 makes the adjustments, using the magnitude and the sign of ERR, to minimize the absolute value of ERR.

Figure 6:
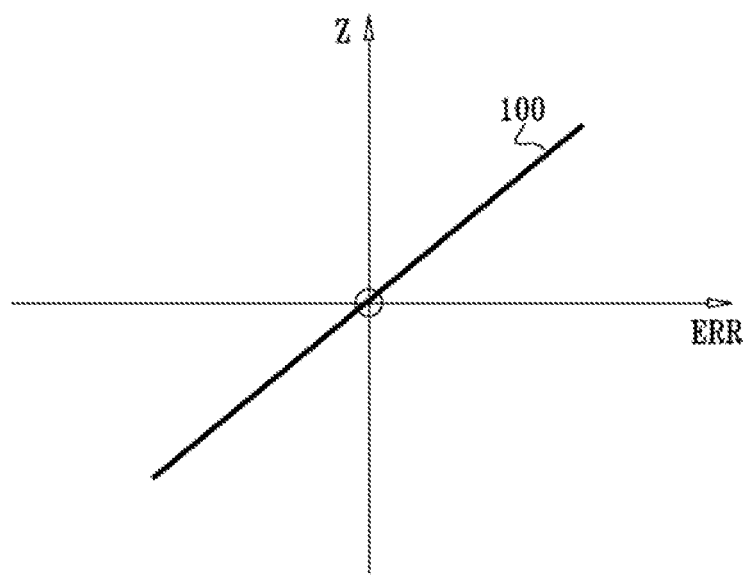
FIG. 6 is a schematic graph of a displacement of a position stage versus an error signal, according to an embodiment of the present invention.

FIG. 6 is a schematic graph 100 of vertical displacement z of stage 36 vs. ERR, according to an embodiment of the present invention. Graph 100 illustrates the vertical displacement z implemented by processor 32, if the processor makes adjustments to the focus of spots 45 by using stage 36. Typically, the relation between z and ERR is approximately linear, and the two parameters are approximately directly proportional. Actual values of z and ERR corresponding to graph 100 may be determined in a calibration phase applied to system 10. During a production phase applied to specimen 39, processor 32 then acts as a feedback control for position controller 34, using the values from the calibration phase to focus spots 45 optimally, i.e., to bring ERR to a value equal or close to zero. Typically, the processor 32 achieves the optimal focus by iteratively activating controller 34. Alternatively, processor 32 may be configured to act as an iterative feedback control for controller 34 without prior determination of values of z and ERR corresponding to graph 100.

It will be appreciated that aberrating element 26 may be configured to introduce aberrations comprising aberrations other than those exemplified above, such as third-order field distortion, into the image produced by system 10. As described above, mutatis mutandis, imaging detector 31 in conjunction with processor 32 generates a measure of the introduced aberration, and processor 32 uses the measure to adjust the focus of spots 45. Thus, the scope of the present invention includes all aberrating elements and aberrations that are able to provide a measure of the introduced aberration for use in adjusting the focus of spots 45.

Figure 7:
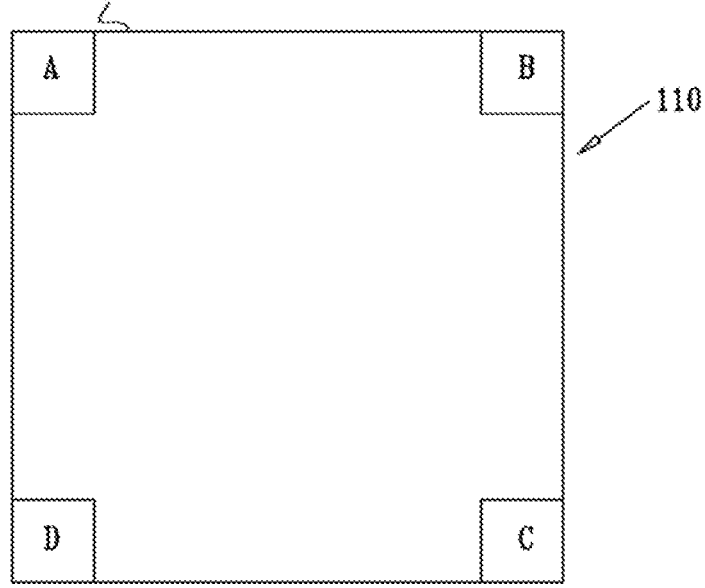
FIG. 7 is an example of an alternative to the images of FIG. 5, according to an embodiment of the present invention.

Returning to FIG. 5, the shape and/or position of areas A, B, C, and D on imager 30 may be adjusted according to the type of aberration generated by element 26, as exemplified by the following description with respect to FIG. 7.

FIG. 7 is an example of an alternative arrangement 110 of areas A, B, C, and D, according to an embodiment of the present invention. Arrangement 110 of the areas on imager 30 may advantageously be used if images 83, 85, and 87, and/or if the ellipses generated as described above with reference to FIG. 2, have their axes at 45° to the horizontal and vertical. In these cases, it will be appreciated that equation (1) still applies.

Unlike prior art focusing systems, embodiments of the present invention work in parallel with normal operation of a system within which they are operative. For example, when used in a scanning electron microscope (SEM), there is no requirement to interrupt the SEM's operation by making a "focus ramp" or by searching for an optimal contrast in the SEM. Since there is no requirement for sample contrast whatsoever, embodiments of the present invention can even work on bare wafers. Furthermore, since no scanning is used, there are no charging artifacts generated.

While the examples described above have assumed that aberrating element 26 is positioned in imaging path 46, it will be appreciated that the element may be located in substantially any position before detector 31. Those skilled in the art will be able to make necessary adjustments to the operation of system 10 to accommodate other positions for element 26. For example, element 26 may be located on irradiation path 42, and operation of the element may cause an increase in focused spot size on surface 38. The effects of such an increase may be compensated for by methods known in the art, such as a repeated scan of surface 38 or an adjustment to lens 18. Thus, all positions for element 26 before detector 31 are assumed to be included within the scope of the present invention.

Figure 8:
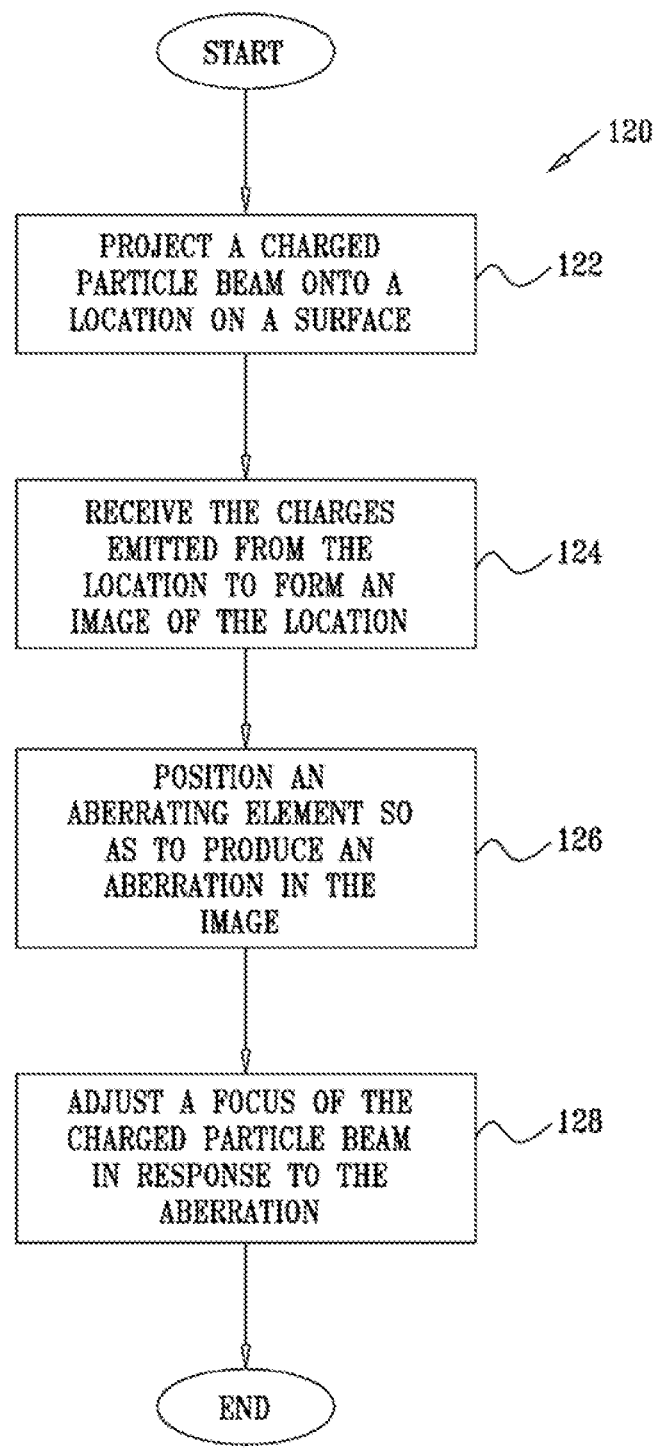
FIG. 8 is a flow chart showing steps involved in a process for focusing a charged particle beam onto a surface, according to an embodiment of the invention

FIG. 8 is a flow chart showing steps involved in a process 120 for focusing charged particle beam 41 onto surface 38 (FIG. 1), according to an embodiment of the invention. While the flow chart shows the steps as sequential, it will be understood that there is no temporal relation between the steps, and that actions of all of the steps typically occur substantially simultaneously.

In an initial step 122, charged particle beam 41 is projected onto a location on surface 38, thus causing charges, typically secondary electrons, to be emitted from the location.

In a second step 124, the charges emitted from the location are received so as to form an image of the location. The charges are usually received in an imager such as imager 30.

In a third step 126 aberrating element 26 has been positioned so as to produce an aberration in the image, for example by being located in imaging path 46.

In a final step 128 of process 120, a processor adjusts a focus of the charged particle beam in response to the aberration. The adjustment may typically be made by adjusting at least one of a generator forming beam 41 and a position of surface 38.

Including an aberrating element 26 is not the only way to achieve the aims of the present invention of keeping one spot or an array of spots in focus while scanning across a sample. An alternative involves the use of additional, astigmatic (e.g., non-rotationally symmetric) spots in the irradiation path to evaluate the focus. By deliberately employing such spots, which will be defocused in the plane of the sample and scanned together with the stigmatic spots of the imaging array, the focus of the imaging beams can be maintained without having to deliberately defocus those beams.

Figure 9:
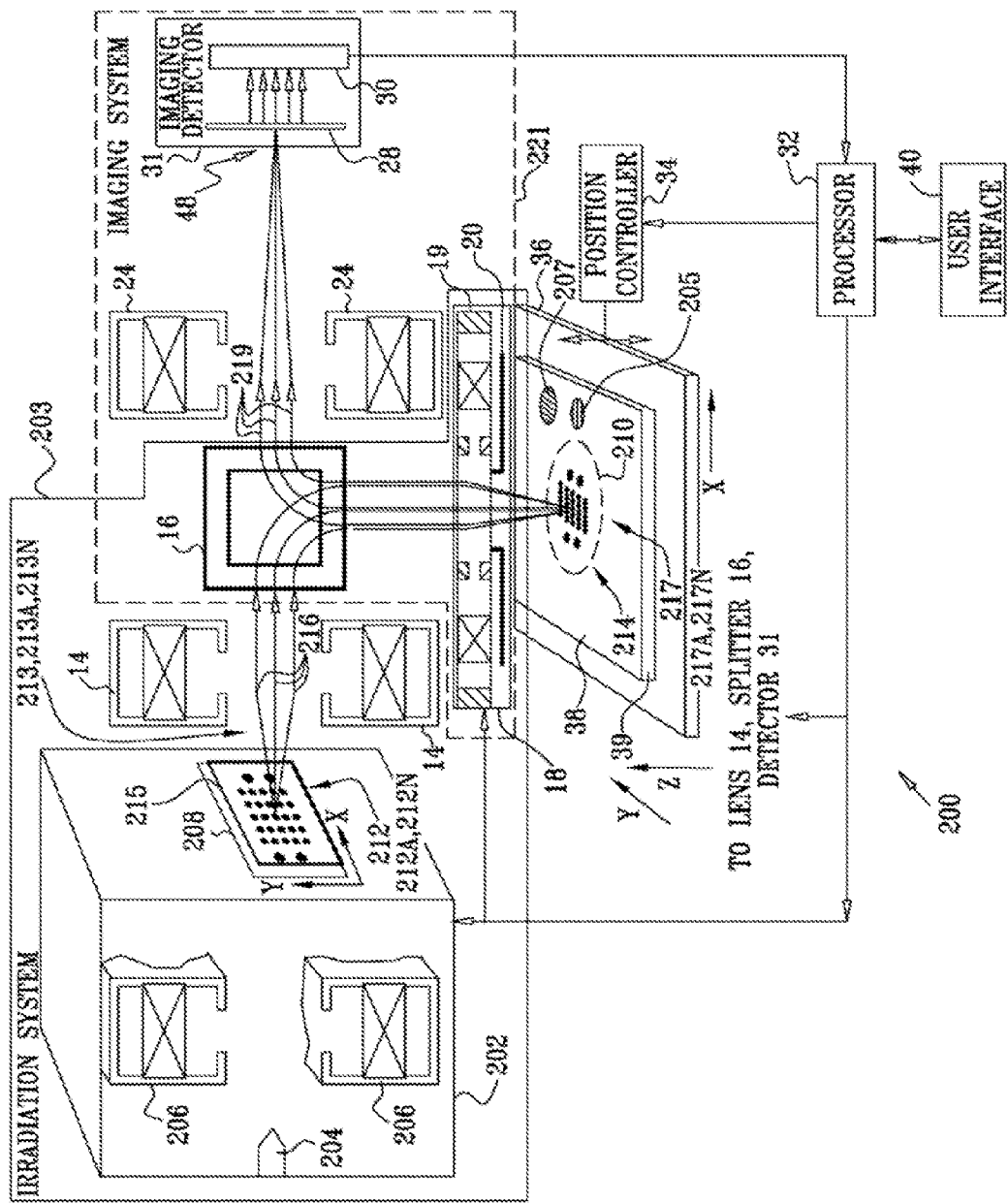
FIG. 9 is a schematic diagram of a charged particle beam focusing system, according to an alternative embodiment of the present invention.

FIG. 9 is a schematic diagram of a charged particle beam focusing system 200, configured according to this alternative embodiment of the present invention. Apart from the differences described below, the operation of system 200 is generally similar to that of system 10 (FIG. 1), and elements indicated by the same reference numerals in both systems 10 and 200 are generally similar in construction and in operation. Unlike system 10, system 200 does not comprise aberrating element 26. Rather, as explained in more detail below, aberrations are introduced into system 200 using a charged particle gun 202, which replaces gun 12 of system 10. Herein below, gun 202 is assumed by way of example to comprise an electron beam gun, but it will be understood that gun 202 may be implemented to generate other charged particles.

Gun 202 comprises a single electron source 204, which typically emits a high electron current of the order of tens or hundreds of microamperes. Electrons generated by the source are collimated by a condenser lens 206, and the collimated beam is then split into a number of separate beams by a planar multi-aperture array element 208 having apertures 212. An electric field (not shown in detail in FIG. 9) below and/or above the apertures 212 of the multi-aperture array element 208 generates an array of electrostatic lenses which focuses the array of charged particle beams 41. Apertures 212 are subdivided into two types of apertures: one or more non-aberration-forming apertures 212N (round apertures), and one or more aberration-forming apertures 212A (non-round apertures). Typically, apertures 212A surround apertures 212N. By way of example, and for clarity in the following description, element 208 is assumed to be rectangular with sides defining local x and y axes, but it will be appreciated that element 208 may be any convenient shape. Also by way of example, element 208 is assumed to comprise four aberration-forming apertures 212A and 25 non-aberration-forming apertures 212N. Element 208 and apertures 212A, 212N are described in more detail below, with reference to FIG. 10A.

Each aperture 212A generates a respective beam 213A, and each aperture 212N generates a respective beam 213N. If apertures 212A surround apertures 212N, beams 213A surround beams 213N. Herein, beams 213A and 213N are also referred to collectively as beams 213. Each beam 213 is focused approximately, but with differences between beams 213A and 213N explained below with reference to FIG. 10B, to a respective region on a plane 215 parallel to element 208. Plane 215 is approximately 100 mm in front of element 208. Each of the beams follows a respective irradiation path 216 from an aperture 212, the paths being generally similar to paths 42 described for the beams from sources 43 (FIG. 1). As for system 10, for clarity in FIG. 9 an irradiation path 216 from only one aperture 212 is illustrated, but it will be understood that generally similar irradiation paths 216 are followed by electron beams 213 from the other originating apertures 212 of multi-aperture array 208.

Multiple beams 213 from multi-aperture array 208 are focused by the one or more lenses 14, beam splitter 16, and objective lens 18 to an array 214 of spots 217A, 217N on surface 38. Spots 217A are formed by beams 213A and spots 217N are formed by beams 213N. Spots 217A and 217N are also referred to collectively herein as spots 217. For apertures 212A surrounding apertures 212N, spots 217A surround spots 217N, so that any charging artifacts introduced by spots 217A are outside the area of interest comprising spots 217N. Lenses 14, beam splitter 16, lens 18, together with gun 202, comprise an irradiation system 203. Changes in array 214, according to whether the array is in focus or out-of-focus on surface 38, are described below with reference to FIG. 11. When in focus, a region 210 surrounding array 214 is also in focus, so that within region 210 aberrations of spots that would be formed, other than those of array 214, are either acceptably small, or correspond to a known and correctable focus effect such as occurs in the case of known field-curvature.

An imaging system 221, generally similar to imaging system 47 except that system 221 does not include element 26, uses the released electrons to form a set of images of spots 217 on imager 30. Thus, as for spots 45 of system 10, each spot 217 generates released electrons which follow imaging paths 219 via objective lens 18, beam splitter 16, and imaging lens 24 to detector 28. For clarity, an imaging path 219 from only one spot 217 is illustrated in FIG. 9, but it will be understood that generally similar imaging paths 219 are followed by the released electrons from the other spots 217.

Processor 32 uses the subset of images of spots 217A to optimize the focus of spots 217N on surface 38, the processor typically adjusting the focus by altering a z-position of surface 38 and/or the focusing of lens 14 and/or the focusing of objective lens 18. By way of example, herein below the focus of spots 217N is assumed to be implemented by altering the z-position of surface 38.

Typically, in addition to adjusting the focus of array 214 on surface 38, processor 32 scans the array over the whole surface. The scanning may be accomplished by scanning the beam in x and y directions or by translating surface 38 in a local y-direction using a y-motion stage (not shown in FIG. 9), and by scanning array 214 in a local x-direction using scanning coils (also not shown in FIG. 9) positioned in system 200 between element 208 and surface 38. By way of example, a location 205 on surface 38 is assumed to comprise a preponderance of lines parallel to the local x-direction, and a location 207 on surface 38 is assumed to comprise a preponderance of lines parallel to the local y-direction. In some embodiments of the present invention, images from locations such as location 205 and 207 may be used in focusing spots 217N, as is described below with reference to FIG. 13.

FIG. 10A is a schematic diagram of multi-aperture array element 208, according to an embodiment of the present invention. Element 208 comprises apertures 212, which in turn comprise the two types of apertures: non-aberration-forming apertures 212N and aberration-forming apertures 212A. Non-aberration-forming apertures 212N are substantially circular and thus do not introduce aberrations, such as astigmatism, into the beams 213N which traverse the apertures. Beams 213N are herein also referred to as non-astigmatic charged particle beams 213N. By way of example, element 208 comprises 25 apertures 212 arranged as a generally rectangular array, and four apertures 212A which surround the array. In some embodiments of the present invention, apertures 212A are larger than apertures 212N by a factor of 2.5 or more. The value of the factor may depend on parameters such as coulomb effects and/or other aberrations which may be introduced into beams 213.

Aberration-forming apertures 212A are non-circular, and do introduce aberrations into beams 213A which traverse the apertures. While apertures 212A may comprise any convenient non-circular shape, for example an oval, a hexagon, or a rectangle, herein below aberration-forming apertures 212A are assumed to comprise ellipses, which generate two-fold astigmatism in the electron beam as the aberration. Other non-circular apertures may be used to generate other types of aberration, such as three-fold astigmatism, and all such apertures and associated types of aberration are assumed to be within the scope of the present invention. Beams 213A are herein also referred to as astigmatic charged particle beams 213A. Aberration-forming apertures 212A are formed in element 208 so as to surround the array of non-aberration forming apertures 212N.

The amount of astigmatism generated by a given ellipse, corresponding to the distance between a sagittal focus and a tangential focus of the electron beam, is a function of the ellipticity of the ellipse. The direction of the astigmatism generated by a given ellipse depends on the orientation of the ellipse. In element 208 apertures 212A comprise apertures 222 and 228 which are ellipses having major axes parallel to the local y axis, and apertures 224 and 226 which are ellipses having major axes parallel to the local x axis. The ellipses typically have ellipticities of the order of 1% or more. The ellipticity of an ellipse is defined by equation (2) below.

$$a.\ E = \frac{A - B}{A + B} \qquad (2)$$

b. where E is the ellipticity of the ellipse
1. A is the length of the major axis, and
2. B is the length of the minor axis.

FIG. 10B is a schematic diagram of electron beam cross-sections formed by the beams from apertures 222 and 224 and one aperture 212, according to an embodiment of the present invention. Apertures 222 and 224 are aberration-forming apertures 212A, and each forms a respective astigmatic charged particle beam 213A. Aperture 212N forms a non-astigmatic charged particle beam 213N. The cross-sections of the beams are shown for plane 215, for a plane 230 parallel to plane 215 and closer to element 208 than plane 215, and for a plane 232 parallel to plane 215 and farther from element 208 than plane 215. Planes 230 and 232 are approximately equidistant from plane 215.

Plane 215 is the plane at which the image formed by beam 213 is in focus, so that the beam cross-section is a smallest possible circle 231. In addition beams 213A from aberration-forming apertures 222 and 224 have as their cross-sections circles 233. At plane 230, beams 213A from apertures 222 and 224 produce respective ellipses 235, 236 having major axes respectively parallel to the local y axis and the local x axis. Beam 213 produces a circle 237 that is larger than smallest possible circle 231. At plane 232, beams 213A from apertures 222 and 224 produce respective ellipses 238, 239 having major axes respectively parallel to the local x axis and the local y axis. Beam 213N produces a circle 240 similar in size to circle 237.

FIG. 11 shows schematic diagrams of array 214 on surface 38, according to an embodiment of the present invention. Each diagram illustrates spots 217 generated by beams 213 on surface 38, at three different vertical levels of the surface. In the following description, spots 217N at the different vertical levels are referred to as spots 260A, 260B, and 260C, and spots 217A are referred to as spots 262A, 264A, 266A, 268A; 262B, 264B, 266B, 268B; and 262C, 264C, 266C, 268C. An image 214B corresponds to optimal focus of beams 213 on the surface, wherein the diameters of circular spots 260B formed by non-astigmatic beams 213N are substantially equal and are as small as possible. The optimal focus is assumed to occur at a vertical position of surface 208 given by a z value, $z_f$, of the surface. At position $z_f$, astigmatic beams 213A from aberration-forming apertures 222, 224, 226, and 228 respectively form substantially circular spots 262B, 264B, 266B, and 268B on surface 38.

An image 214A corresponds to beams 213 being under-focused on surface 38, surface 38 being above the optimal focus position $z_f$, at a vertical position $z_{uf}$. At position $z_{uf}$, the diameters of circular spots 260A are larger than focused spots 260B. Also at position $Z_{uf}$, beams 213A from aberration-forming apertures 222 and 228 respectively form ellipses 262A and 268A having major axes parallel to the local y axis of surface 38, and beams 213A from aberration-forming apertures 224 and 226 respectively form ellipses 264A and 266A having major axes parallel to the local x axis.

An image 214C corresponds to beams 213 being over-focused on surface 38, surface 38 being below the optimal focus position $z_f$, at a vertical position $z_{of}$. At position $z_{of}$, the diameters of circular spots 260C are larger than focused spots 260B, and are typically of the order of the size of spots 260A. Also at position $z_{of}$, beams 213A from aberration-forming apertures 222 and 228 respectively form ellipses 262 and 268C having major axes parallel to the local x axis of surface 38, and beams 213A from aberration-forming apertures 224 and 226 respectively form ellipses 264C and 266C having major axes parallel to the local y axis.

FIG. 12 is a schematic diagram showing regions of imager 30, according to an embodiment of the present invention. As described above, array 214 is imaged by imaging system 221 onto imager 30, which is divided into regions. A region 270 receives images generated by electrons released from surface 38 in response to spots 217N formed by beams 213N. Region 270 is divided into 25 sub-regions 271, each sub-region corresponding to one of spots 217N. Regions 272, 274, 276, and 278 receive images generated by electrons released from surface 38 in response to spots 217A. Regions 272, 274, 276, and 278 respectively correspond to beams 213A from apertures 222, 224, 226, and 228. Regions 272, 274, 276, and 278 are also referred to herein as regions A, B, C, and D.

Processor 32 uses signals from regions A, B, C, and D to determine an optimal focus for beams 213N. The processor typically focuses beams 213N by varying a z position of surface 38 and/or the focusing of the beams by lens 14 and/or lens 20. Herein below, processor 32 is assumed to focus beams 213N by varying the z position of surface 38.

Figure 13:
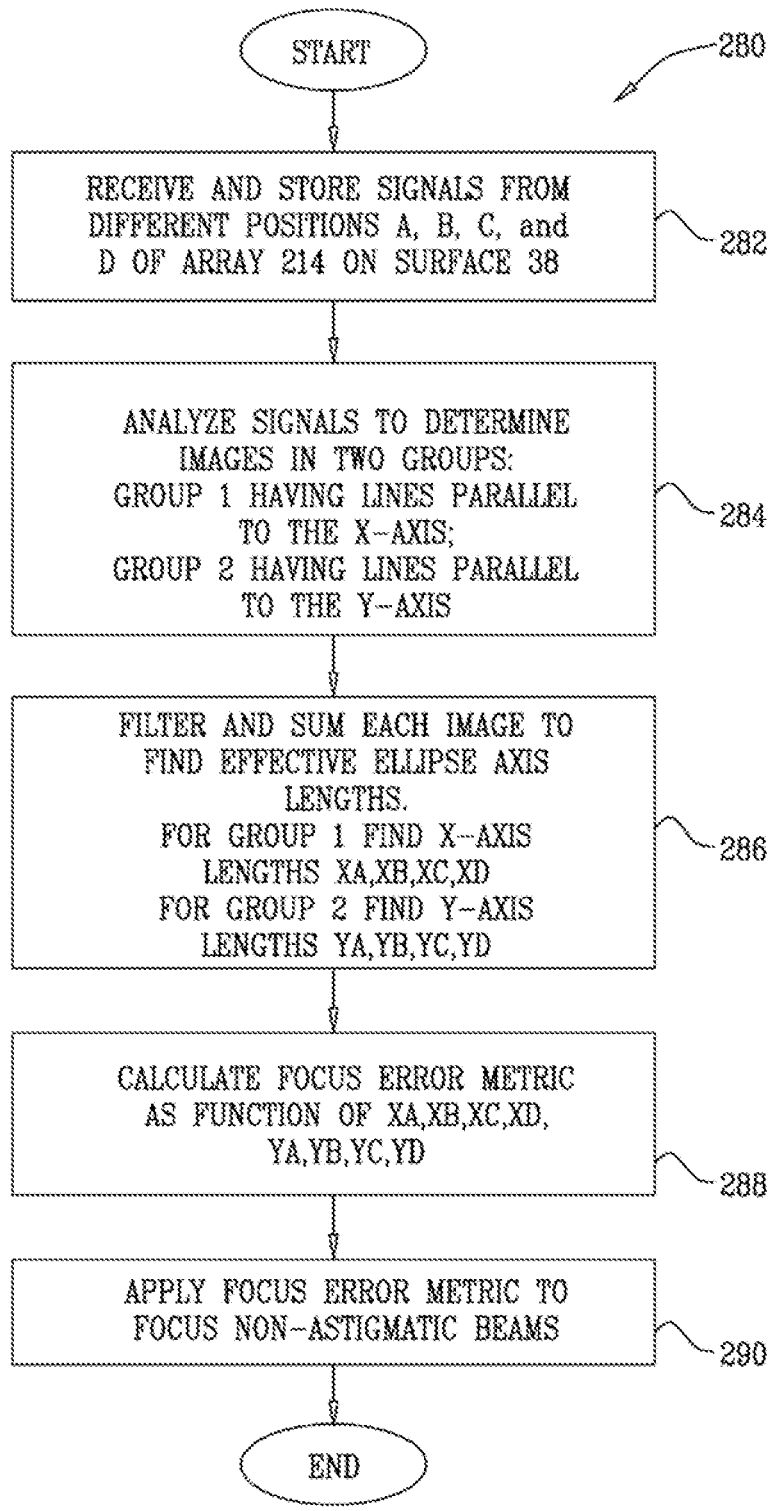
FIG. 13 is a flowchart showing steps followed by a processor in focusing beams in the system of FIG. 9, according to an embodiment of the present invention.

FIG. 13 is a flowchart showing a process 280 of steps followed by processor 32 in focusing beams 213N, according to an embodiment of the present invention. Flowchart 280 is assumed to be implemented as surface 38 is scanned in an x and a y direction by the processor.

In a first step 282, processor 32 receives signals from regions A, B, C, and D for different positions (x, y) of array 214 on surface 38. The signals correspond to images of locations of surface 38. Processor 32 stores the signals as respective sets of images $\{I_A(x, y)\}$, $\{I_B(x, y)\}$, $\{I_C(x, y)\}$, and $\{I_D(x, y)\}$.

In a second step 284, processor 32 analyzes the sets of images to determine two groups of images: a first group corresponding to regions, such as location 205 (FIG. 9) on surface 38, having a preponderance of structures parallel to the local x axis, and a second group corresponding to regions, such as location 207 on surface 38, having a preponderance of structures parallel to the local y axis. Processor 32 performs the analysis using any convenient edge-detection algorithm, typically by analyzing signal gradients in the x and y directions in order to find high gradient values.

In a third step 286, processor 32 applies a high-pass filtering operation, followed by summation, to the pixels of the images in each group. The application of the filtering operation and summation to images of regions with a preponderance of x or y lines generates a value of an effective number of pixels in the image which is proportional to a length of the y or x axis, respectively, of the ellipse being analyzed. For the first group of signals, the processor determines average x values $X_A$, $X_B$, $X_C$, and $X_D$. For the second group of signals, the processor determines average y values $Y_A$, $Y_B$, $Y_C$, and $Y_D$.

In a fourth step 288, processor 32 calculates a focus error metric FE(z) according to the following equation:

$$FE(z)=w_Y[(Y_A+Y_D)-(Y_B+Y_C)]+w_X[(X_B+X_C)-(X_A+X_D)] \quad (3)$$

a. where $w_X$, $w_Y$, are weighting factors which may be used to compensate for differences in an x line concentration and a y line concentration in the first and second group respectively.

In a final step 290, processor 32 applies the value of FE(z) to position controller 34, so adjusting the z position of surface 38 so that beams 213N are in focus.

Process 280 then ends.

The following three numerical examples illustrate calculating values of FE(z), and how processor 32 uses the values to adjust the focus of beams 213. The examples assume that images 214A, 214B, and 214C (FIG. 11) are imaged on x lines of surface 38 such as at location 205, and on y lines of the surface such as at location 207. Each ellipse in image 214A and 214C is assumed to have a major axis length 1.01 and a minor axis length 0.99, giving an ellipticity of approximately 1%. The circles 262B, 264B, 266B, and 268B are assumed to have radii 1.00. In all examples, the values of $X_A$, $X_B$, $X_C$, and $X_D$, and of $Y_A$, $Y_B$, $Y_C$, and $Y_D$, derived in step 286 of flowchart 280, are nominally assumed to be 100 times the lengths of the major and minor axes of the ellipses, or 100 times the diameters of the circles. Furthermore, $w_X$, $w_Y$, are assumed to be equal, and are arbitrarily set equal to 1.

For the first example, applying values from under-focused image 214A to equation (3) gives:

$$FE(z)=1[(101+101)-(99+99)]+1[(101+101)-(99+99)] \\ =+8 \tag{3a}$$

For the second example, applying values from focused image 214B to equation (3) gives:

$$FE(z)=1[(100+100)-(100+100)]+1[(100+100)-(100+100)]=0 \tag{3b}$$

For the third example, applying values from over-focused image 214C to equation (3) gives:

$$FE(z)=1[(99+99)-(101+101)]+1[(99+99)-(101+101)] \\ =-8 \tag{3c}$$

Inspection of the values of metric FE(z) given by equations (3a), (3b), and (3c) shows that the metric is positive for the under-focused image, is zero for the focused image, and is negative for the over-focused image.

From consideration of process 280 and the above numerical examples, it will be understood that the value of FE(z) has a direct relation with the ellipticities and orientations of the ellipses formed on surface 38 by astigmatic beams 213A as spots 217A. As the ellipticities increase the absolute value of FE(z) increases, and the sign of FE(z) varies according to the orientation of the ellipses, so that FE(z) may be used to adjust for both under- and over-focusing. Furthermore, by forming the sizes of apertures 212A to be larger than the sizes of apertures 212N, typically by the factor of 2.5 or more described above, the absolute value of FE(z) for a given amount of under- or over-focusing is increased.

Figure 14:
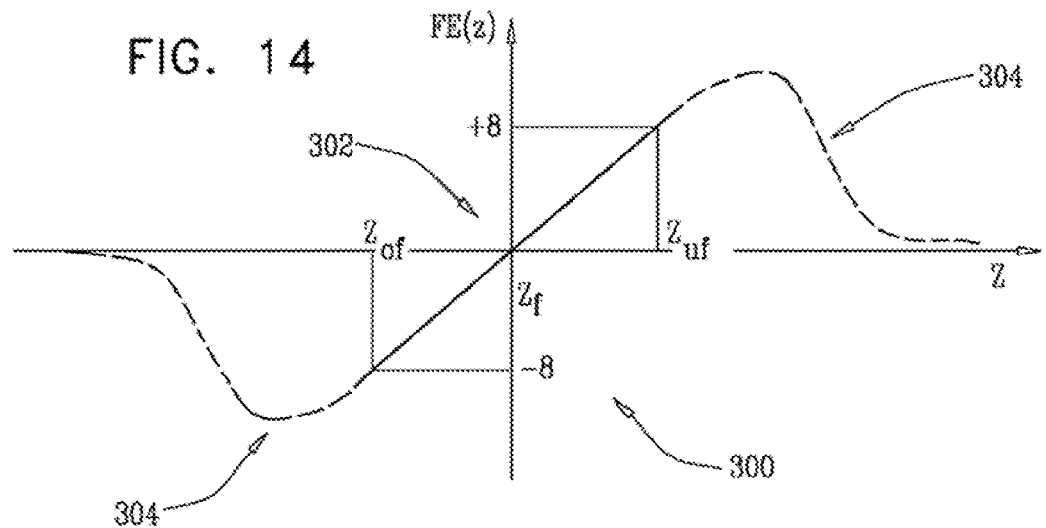
FIG. 14 is a schematic graph that plots the value of a focus metric vs. the z position of the surface of a specimen, according to an embodiment of the present invention.

FIG. 14 is a schematic graph 300 that plots the value of metric FE(z) vs. z position of surface 38, according to an embodiment of the present invention. The graph plots the results given by equations (3a), (3b), and (3c). As illustrated by graph 300, in a vicinity 302 of the optimal focus, $z=z_f$, the graph is substantially linear, and the linearity is advantageously used by processor 32 to automatically maintain surface 38 at its optimal focus. In regions outside vicinity 302, the graph may not be linear, but may remain monotonic, so that the processor may continue to use the calculated value of metric FE(z) to automatically return the non-astigmatic beams to the optimal focus. Even beyond the monotonic regions, in regions such as regions 304, processor 32 may use the sign of FE(z) to correctly adjust the focus of surface 38, and to return to vicinity 302.

Referring back to process 280, measurements of the ellipticities and orientations of the ellipses of spots 217A are enhanced by using images having lines parallel to the axes of the ellipses. In alternative embodiments of the present invention, such enhancement is not required, so that substantially any image from surface 38 on imager 30 may be used to determine the ellipticities and orientations of spots 217A. For example, dimensions of apertures 212A may be chosen so that direct measurements of the ellipticities and orientations may be made. Alternatively or additionally, regions A, B, C, and D of imager 30 may be implemented to comprise sufficient numbers of pixels so that the direct measurements referred to above may be made. The direct measurements may be made, mutatis mutandis, using a method generally similar to that described above with respect to FIG. 5, and a focus error metric generally similar to that described above with respect to equation (1) may be used.

Figure 15:
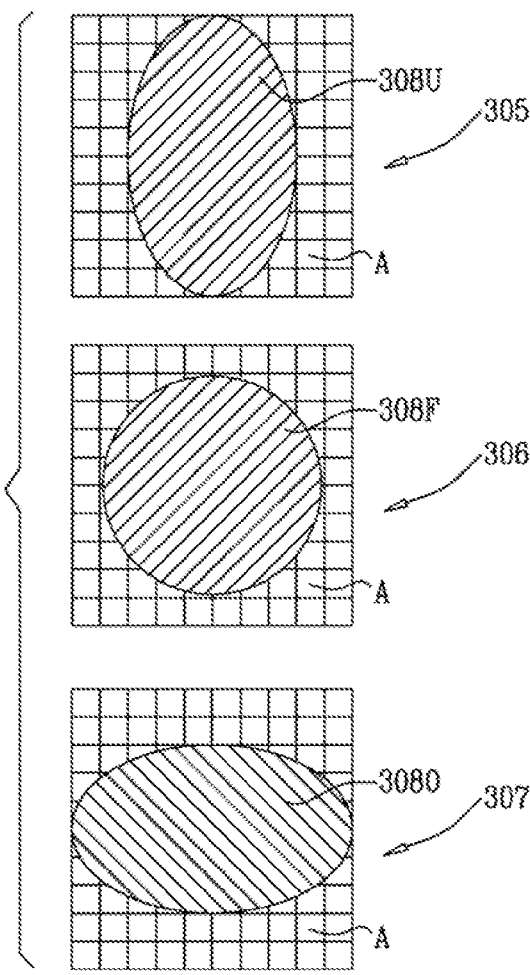
FIG. 15 illustrates a method for determining the ellipticity and orientation of an image generated on a region of an imager, according to an embodiment of the present invention.

FIG. 15 illustrates such a direct method for determining the ellipticity and orientation of an image generated on region A, according to an embodiment of the present invention. Region A is assumed by way of example to comprise 10×10 pixels. Diagrams 305, 306, and 307 respectively illustrate images 308U, 308F, and 308O generated on region A due to under-focusing, in-focus, and over-focusing of a spot 217A on surface 38. From consideration of the diagrams, it will be understood that by analyzing the pixels of region A processor 32 may determine both the ellipticity and the orientation of the ellipse imaged on region A, and so generate an appropriate focus error metric.

Embodiments of the present invention generate astigmatic and non-astigmatic beams simultaneously, and both types of beams are projected through a common irradiation system before impinging on a surface being examined. The description above (FIGS. 9-15) has related to element 208, comprising a rectangular array of non-aberration-forming apertures 212N, and aberration-forming apertures 212A which are ellipses having axes parallel to axes of the rectangular array. However, there is no requirement that the one or more non-aberration-forming apertures 212N are arranged in a regular array, so that a plurality of such apertures may be arranged in substantially any convenient regular or irregular pattern. Furthermore, there is no requirement that the one or more aberration-forming apertures 212A are related geometrically to the non-aberration-forming apertures 212N, so that in the case of elliptical aberration-forming apertures, the axes of the ellipses may be different from each other, and different from any axes associated with the non-aberration-forming apertures.

Figure 16:
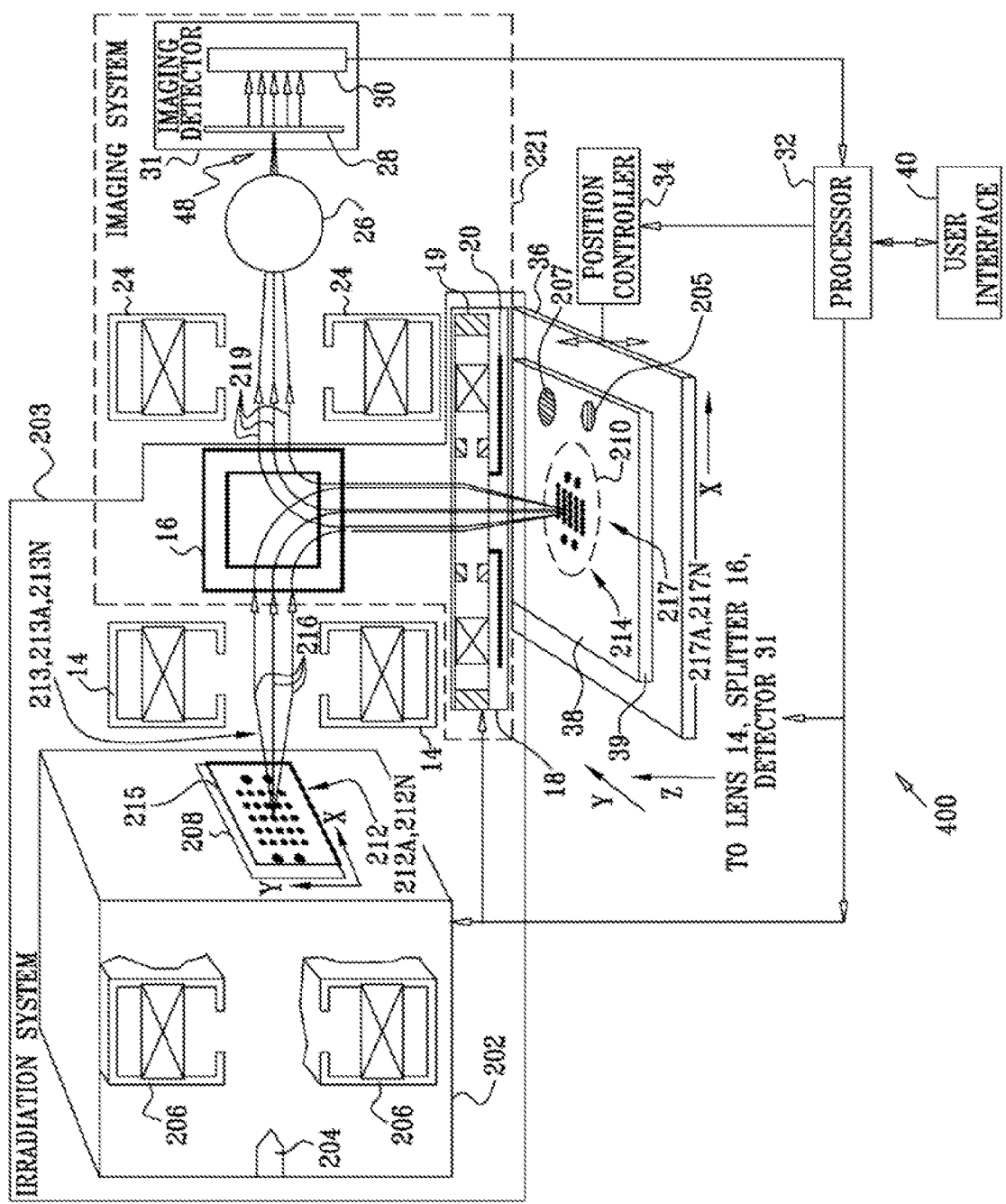
FIG. 16 is a schematic diagram of a charged particle beam focusing system, according to a further alternative embodiment of the present invention.

FIG. 16 is a schematic diagram of a charged particle beam focusing system 400, according to a further alternative embodiment of the present invention. Apart from the differences described below, the operation of system 400 is generally similar to that of system 10 and system 200 (FIGS. 1 and 9), and elements indicated by the same reference numerals in systems 10, 200 and 400 are generally similar in construction and in operation. In system 400, aberrating element 26 is introduced before detector 31, typically in imaging paths 219, and operates generally as described for system 10. Thus, system 400 combines the focusing methods of system 10 with the focusing method of system 200. Such a combination may utilize the focusing method of system 10 or the focusing method of system 200 separately and at different times, or the two methods may be applied in combination substantially at the same time, to achieve optimal focusing for charged particle beams on substantially any type of surface 38.

Figure 17:
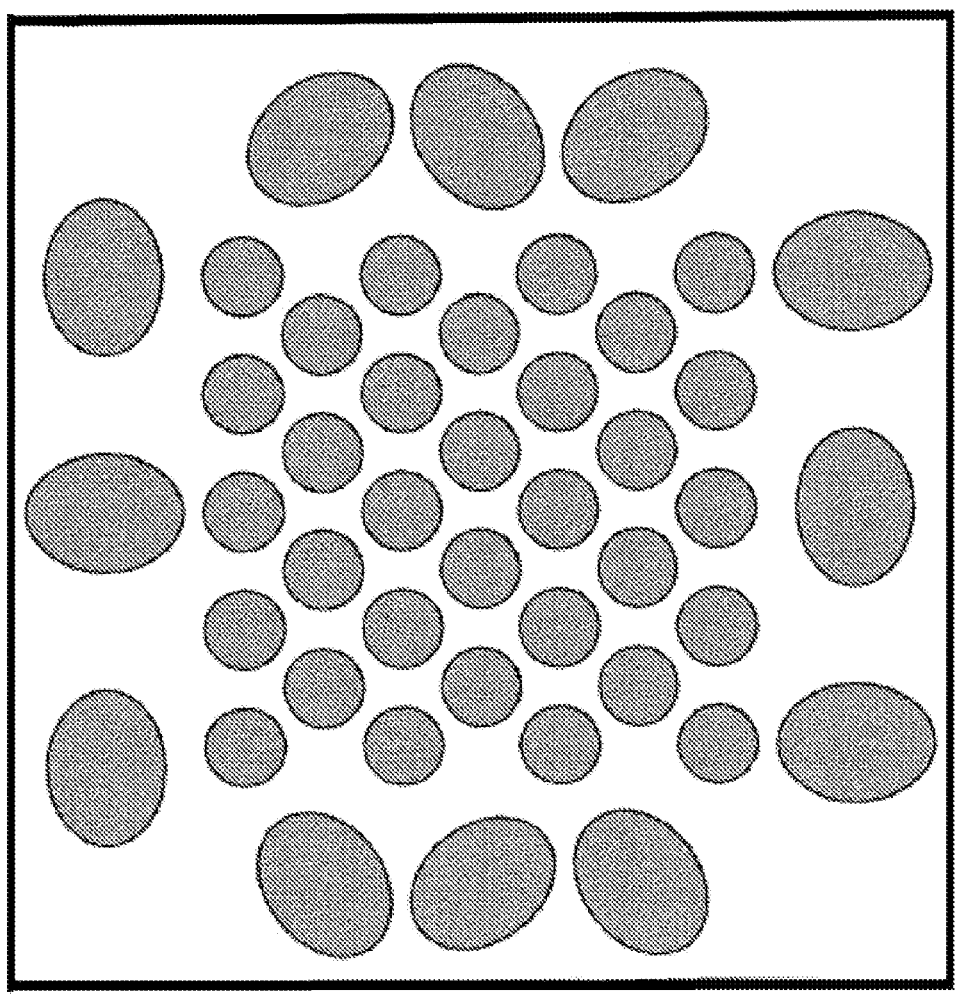
FIG. 17 illustrates an alternative example of a multi-aperture array which may be used in accordance with embodiments of the present invention.

In FIGS. 9 and 16, a generally rectangular multi-aperture array (MAA) 208 was assumed. However, other MAAs may be used in accordance with the present invention, and an example of an alternative MAA is shown in FIG. 17. In this example MAA 208' includes non-aberration forming apertures 212N' and multiple aberration forming apertures 212A'. Unlike MAA 208, however, this MAA 208' is generally square in shape and the aberration forming apertures 212A' are not only oriented with their major axes orthogonal to one another. Instead, some of aberration forming apertures may be oriented with their major axes at non-right angles to major axes of others of the aberration forming apertures. This variation of orientations may improve overall sensitivity to variations in focus as compared with systems employing only orthogonally oriented aberration forming apertures. Of course, aberration forming apertures oriented with their major axes at non-right angles to major axes of others of the aberration-forming apertures could also be included on MAAs that are generally rectangular, circular, or other shapes and the use of same is not limited to MAAs that are generally square.

In addition to aberration forming apertures oriented with their major axes at non-right angles to major axes of others of the aberration-forming apertures, alternative embodiments of the invention may employ MAAs with relatively large (e.g., as compared to the non-aberration forming apertures) aberration forming apertures. Of course, these large aberration forming apertures may also be used in connection with MAAs in which the aberration forming apertures are oriented with their major axes at right angles to major axes of others of the aberration-forming apertures as well. The use of such large apertures may improve sensitivity to focus in systems employing such MAAs as compared to those which employ MAAs having only relatively small apertures. When large apertures are used, it may be beneficial to employ a pre-aperture in the path of the charged particles (e.g., between the charged particle gun and the MAA) so as to limit the beam current of larger aberration forming apertures.

Figure 18:
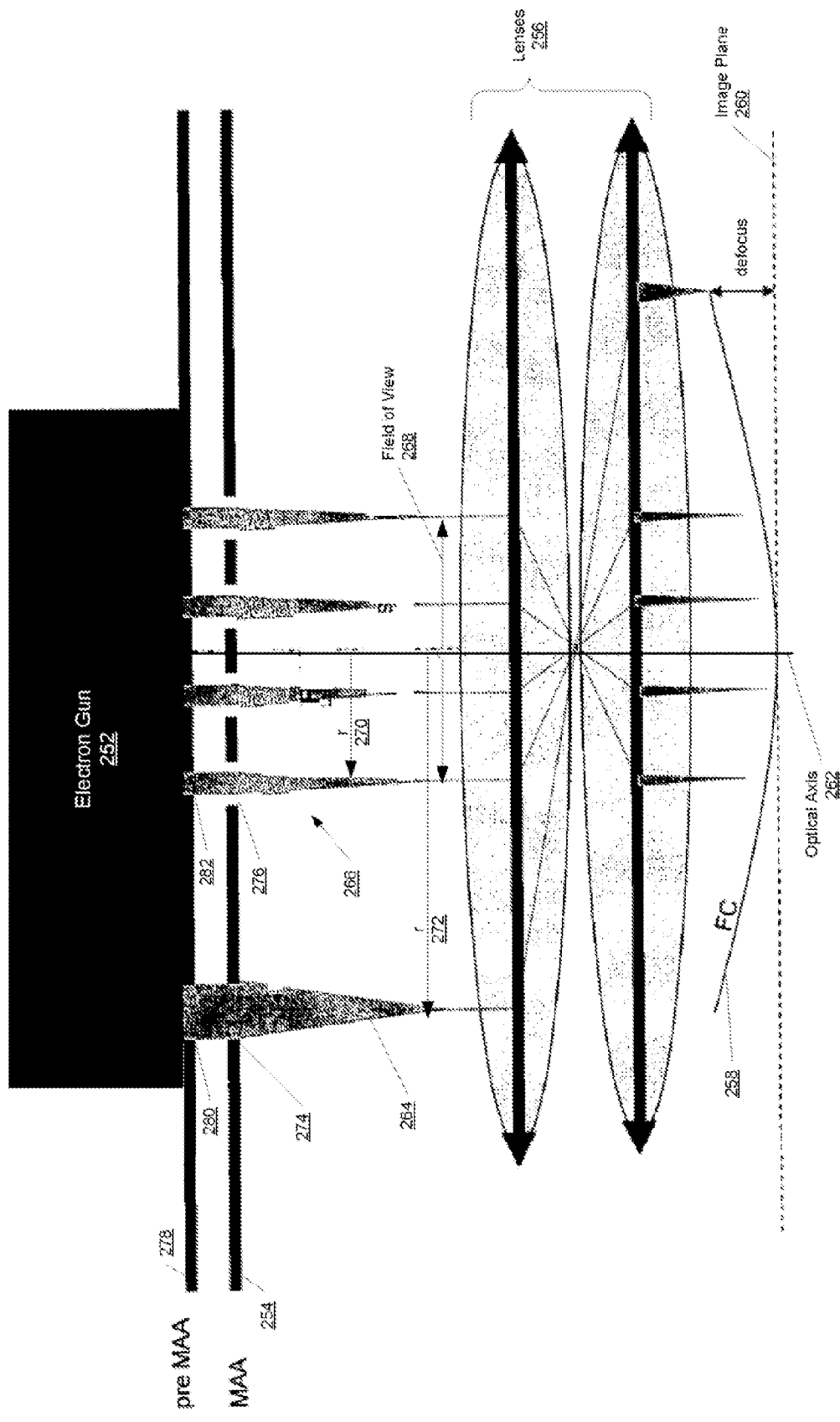
FIG. 18 illustrates the use of field curvature of lenses in an irradiation path to provide static defocused beams for obtaining astigmatism information in accordance with an embodiment of the present invention.

Still a further embodiment of the present invention relies obtaining astigmatism information from defocused beams outside a field of view (FOV) of an array of beams, where the defocusing results from the field curvature of elements such as the one or more lenses 14, beam splitter 16, and objective lens 18. Because the field curvature of these elements may introduce only a small amount of defocusing, relative to the focused beams in the array, the statistics of multiple defocused beams may be used to increase the information available for computation. FIG. 18 illustrates the use of field curvature to provide defocused beams.

Irradiation system 250 includes a charged particle source 252 (e.g., a charged particle gun 202 or other source) and a multi-aperture array 254. In this illustration, lenses and other elements present in the irradiation path are represented by a pair of lenses 256, however, this is not meant to imply that only two lenses are present in the irradiation path or that such a path does not include other elements as well. The lenses are illustrated only for the purpose of pointing out the field curvature 258 of the irradiation system as a deviation from an ideal image plane 260.

The variation in focus of individual beams produced by charged particle source 252 and MAA 254 as a result of the field curvature of lenses 256 is proportional to the radial distance of the subject beam from the optical axis 262 of the lens system. Accordingly, in order to obtain as much defocus as possible the beams 264 used for determining astigmatism information are positioned as far as practicable from optical axis 262. In contrast, the beams 266 used for imaging the specimen are grouped in a field of view 268 centered around the optical axis 262 within a radial distance 270 selected to minimize and focal variations among beams 266 due to the field curvature of the lenses. In practice, radial distance 270 may be on the order of 54 µm, while the radial distance 272 for the defocused beams 264 may be on the order of 2 to 3 times radial distance 270.

Figure 19B:
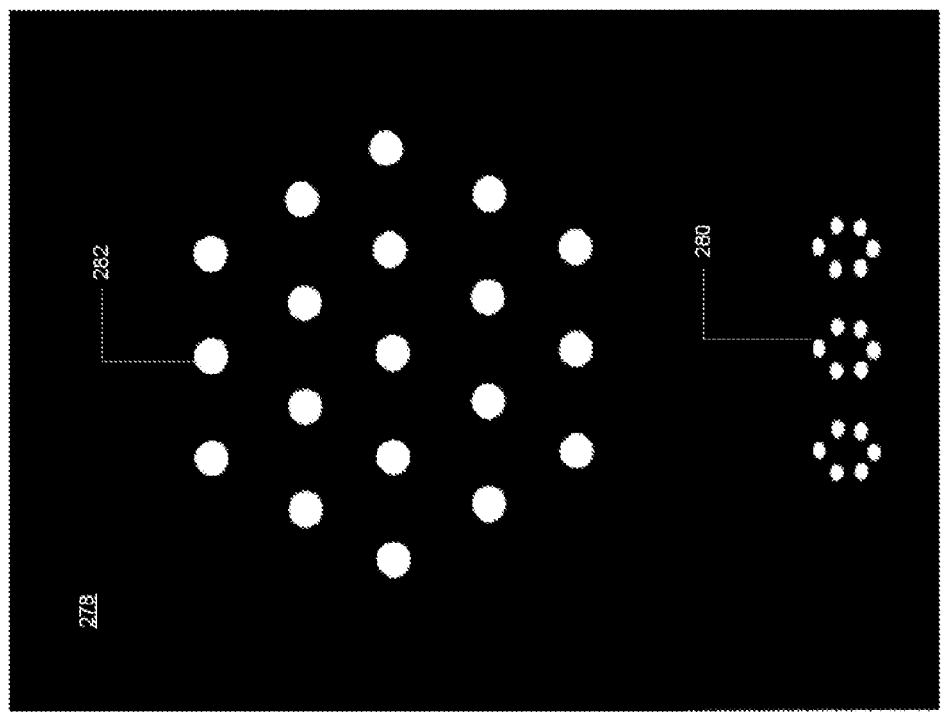
FIGS. 19A and 19B illustrate examples of a multi-aperture array and a pre-multi aperture array suitable for use in connection with the system illustrated in FIG. 18.
Figure 19A:
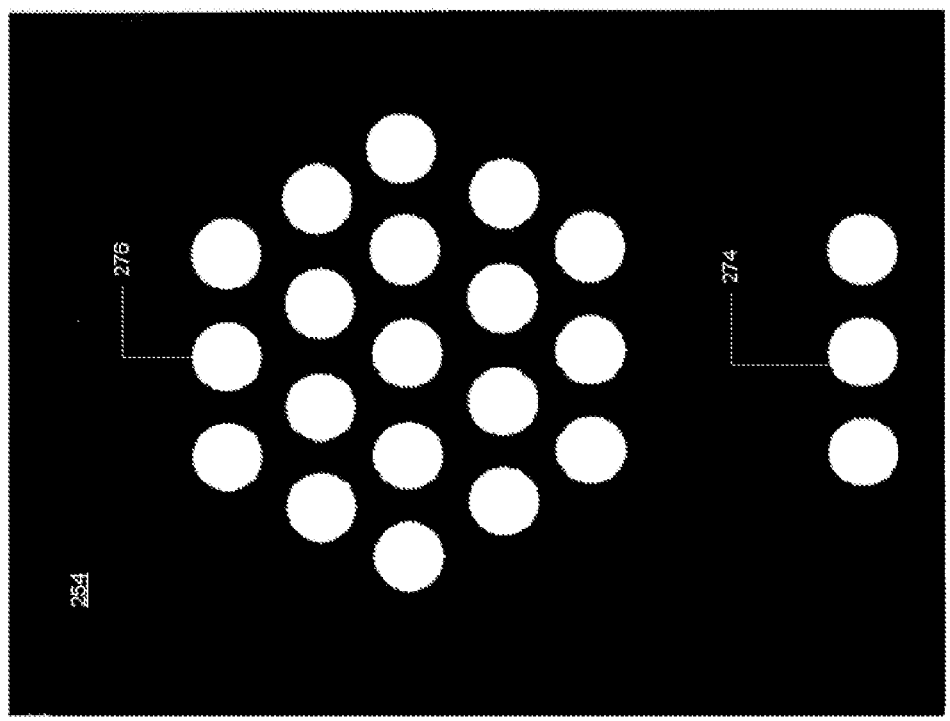

The astigmatism information available through the use of defocused beams 264 is proportional to the product of the amount by which the defocused beams are out of focus, the size of the aperture in MAA 254 and the square root of N, where N is the number of such defocused beams that are used to collect the astigmatism information. Accordingly, in order to obtain as much astigmatism information as possible, the size of the apertures 274 used to form the defocused beams 264 is greater than the size of the apertures 276 used to form the imaging beams 266. In practice, apertures 274 may be on the order of 60-240 µm in diameter. In order to limit the beam current that would otherwise be produced using such large apertures, one or more pre-MAAs 278, with smaller and/or shaped apertures 280 may be employed. IN some embodiments of the invention, apertures 280 in pre-MAA 278 may be one-half to one-eighth the diameter of apertures 274 in MAA 254. Apertures 282 in pre-MAA 278 for beams 266 may also be smaller than apertures 276 in MAA 254. For example, apertures 282 may have diameters on the order of one-half the diameter of apertures 276. FIGS. 19A and 19B illustrate examples of MAA 254 and pre-MAA 278, respectively.

Figure 20:
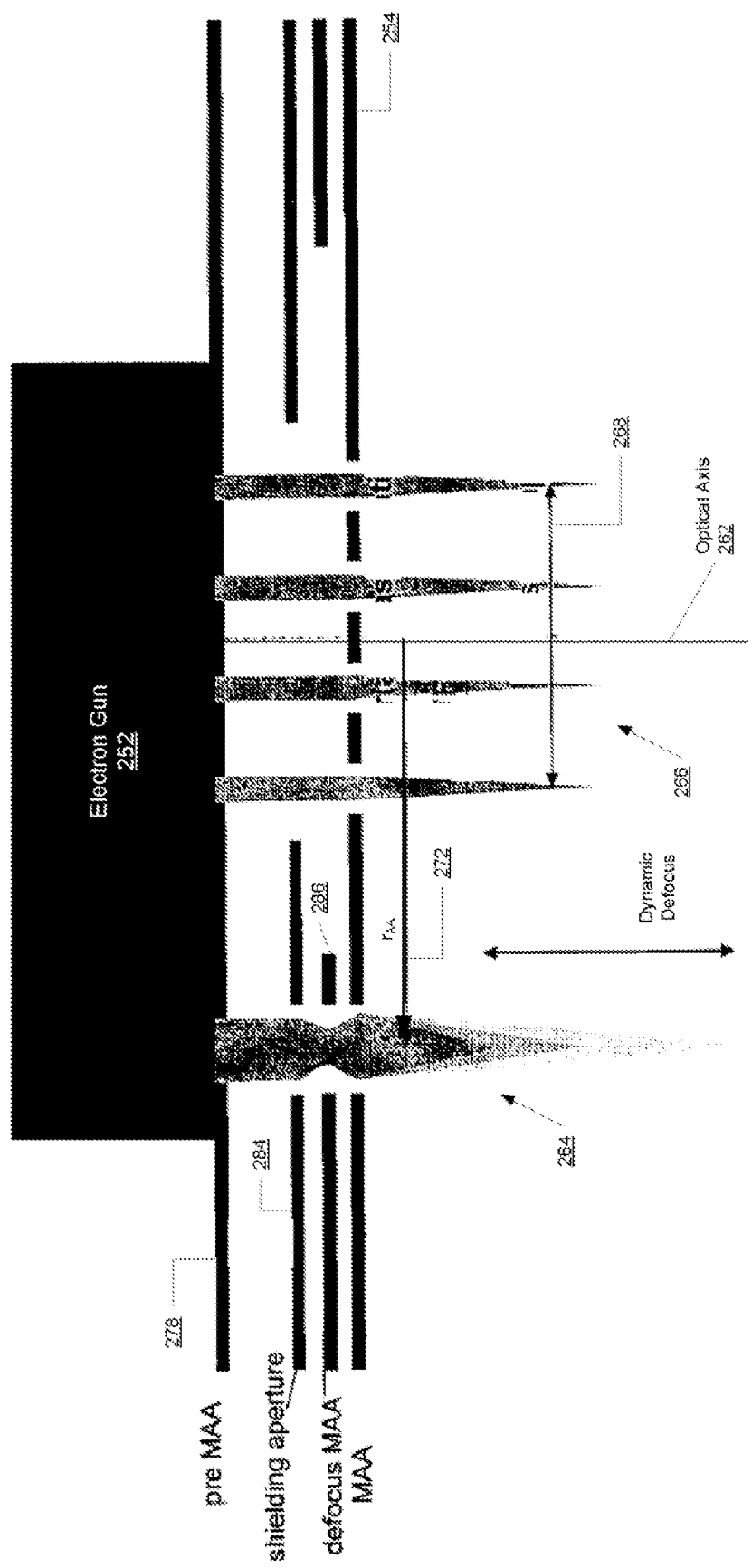
FIG. 20 illustrates portions of a system employing dynamic defocused beams for obtaining astigmatism information in accordance with an embodiment of the present invention.

FIG. 20 illustrates still a further embodiment of the present invention. As with the embodiment illustrated in FIG. 18, this example makes use of defocused beams 264 located at a distance $r_{AA}$ 272 from an optical axis 262 to provide information concerning astigmatism. Unlike the previous example, however, the embodiment illustrated in FIG. 20 does not rely upon a static amount of defocus introduced by the field curvature of lenses or other elements in an irradiation path. Instead, a dynamic defocus is introduced through the use of a defocus MAA 286.

The defocus MAA 286 and an accompanying shielding aperture 284 are introduced in the overall MAA which shapes the defocus beams 264 and irradiating beams 266. The defocus MAA 286 is maintained at potentials different than those at which the pre MAA 278 and MAA 254 are maintained. Preferably, the defocus MAA 286 is provided with a variable potential under the control of an auto-focus controller (not shown). By applying different potentials to defocus MAA 286, the amount of defocus introduced in the defocus beams 264 may be controlled. Shielding aperture 284 may be at another potential so as to ensure that the effect of the defocus MAA 286 does not interfere with the field of view 268 of the irradiating beams 266. In other embodiments, the shielding aperture 284 may be at the same potential as MAA 254 and/or pre MAA 278.

By employing the dynamic defocus capability, a single or fewer defocus beam 264 may be used in place of the multiple defocus beams inasmuch as the single or small number of defocus beams can be manipulated (via the defocus MAA 286) to have varying amounts of defocus and astigmatism information gathered for these varying amounts of defocus. Whether through these of static defocused beams or dynamic defocused beams, the use of such beams separate from the irradiating beams used to image the sample aids in the detection and correction (on-the-fly) of astigmatisms before the astigmatism causes noticeable effects in the imaging beams.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

What is claimed is:
1. A method comprising:
    producing simultaneously at least one non-astigmatic charged particle beam and at least one astigmatic charged particle beam;
    forming, from the at least one non-astigmatic charged particle beam, a corresponding set of images of a surface;

forming, from the at least one astigmatic charged particle beam, a corresponding set of images of the surface; and focusing, by a processor, the at least one non-astigmatic charged particle beam using the set of images that correspond to the at least one astigmatic charged particle beam.

2. The method of claim 1, wherein producing simultaneously the at least one non-astigmatic charged particle beam and the at least one astigmatic charged particle beam comprises:

projecting a plurality of charged particle beams through a set of apertures in the multi-aperture array to produce the at least one astigmatic charged particle beam; and projecting the plurality of charged particle beams through another set of apertures in the multi-aperture array to produce the at least one non-astigmatic charged particle beam, wherein the set of apertures to produce the at least one astigmatic charged particle beam are in a position further from an optical axis than the other set of apertures to produce the at least one non-astigmatic charged particle beam.

3. The method of claim 1, wherein producing simultaneously the at least one non-astigmatic charged particle beam and the at least one astigmatic charged particle beam comprises:

projecting a plurality of charged particle beams through a set of apertures in the multi-aperture array to produce the at least one astigmatic charged particle beam; and projecting the plurality of charged particle beams through another set of apertures in the multi-aperture array to produce the at least one non-astigmatic charged particle beam, wherein the set of apertures to produce the at least one astigmatic charged particle beam are at a radial distance that is 2 to 3 times further from an optical axis than a radial distance of at least some of the other set of apertures to produce the at least one non-astigmatic charged particle beam.

4. A method comprising:

producing simultaneously a plurality of non-astigmatic charged particle beams and a plurality of astigmatic charged particle beams;

applying different potentials by a defocus multi-aperture array to reduce a number of astigmatic charged particle beams in the plurality of astigmatic charged particle beams;

forming, from the plurality of non-astigmatic charged particle beams, a corresponding set of images of a surface;

forming, from the reduced number of astigmatic charged particle beams, a corresponding set of images of the surface; and focusing, by a processor, the plurality of non-astigmatic charged particle beams using the set of images that correspond to the reduced number of astigmatic charged particle beams.

5. The method according to claim 4, wherein the different potentials comprise a potential different than that of a multi-aperture array.

6. The method of claim 4, wherein focusing the set of images that correspond to the plurality of non-astigmatic charged particle beams comprises:

varying amounts of defocus on the reduced number of astigmatic charged particle beams to gather focus information for the varying amounts of defocus.

7. The method of claim 4, wherein producing simultaneously a plurality of non-astigmatic charged particle beams and a plurality of astigmatic charged particle beams comprises:

limiting a beam current via apertures in a pre-multi-aperture array element.

8. A beam source for an imaging system, comprising:

a charged particle source; and a multi-aperture array coupled to the charged particle source and positioned to receive a plurality of charged particle beams produced by the charged particle source to simultaneously produce at least one non-astigmatic charged particle beam and at least one astigmatic charged particle beam, the at least one non-astigmatic charged particle beam forming a corresponding set of images of a surface and the at least one astigmatic charged particle beam forming a corresponding set of images of the surface, wherein the imaging system is configured so that the set of images that correspond to the at least one astigmatic charged particle beam is used to focus the at least one non-astigmatic charged particle beam.

9. The beam source for the imaging system of claim 8, wherein the multi-aperture array comprises apertures to produce the at least one astigmatic charged particle beam and apertures to produce the at least one non-astigmatic charged particle beam, the apertures to produce the at least one astigmatic charged particle beam being in a position further from an optical axis than the apertures to produce the at least one non-astigmatic charged particle beam.

10. The beam source for the imaging system of claim 8, wherein the multi-aperture array comprises apertures to produce the at least one astigmatic charged particle beam and apertures to produce the at least one non-astigmatic charged particle beam, the apertures to produce the at least one astigmatic charged particle beam being in a position at a radial distance that is 2 to 3 times further from the optical axis than a radial distance of at least some of the apertures in the multi-aperture array used to produce the at least one non-astigmatic charged particle beam.

11. The beam source for the imaging system of claim 8, wherein the multi-aperture array comprises apertures to produce the at least one astigmatic charged particle beam and apertures to produce the at least one non-astigmatic charged particle beam, the apertures to produce the at least one astigmatic charged particle beam being larger than the apertures in the multi-aperture array used to produce the at least one non-astigmatic charged particle beam.

12. The beam source for the imaging system of claim 11, further comprising a pre-multi-aperture array element positioned between the charged particle source and the multi-aperture array, the pre-multi-aperture array element comprising apertures that smaller than the apertures in the multi-aperture array which are used to produce the at least one astigmatic charged particle beam.

13. The beam source for the imaging system of claim 12, wherein the pre-multi-aperture array element further comprises apertures that are smaller than the apertures in the multi-aperture array which are used to produce the at least one non-astigmatic charged particle beam.

14. A beam source for an imaging system, comprising:

a charged particle source;

a multi-aperture array coupled to the charged particle source and positioned to receive a plurality of charged particle beams produced by the charged particle source to simultaneously produce a plurality of non-astigmatic charged particle beams and a plurality of astigmatic charged particle beams and a dynamic defocus multi-aperture array coupled to the multi-aperture array to reduce a number of astigmatic charged particle beams in the plurality of astigmatic charged particle beams, the plurality of non-astigmatic charged particle beams resulting in a corresponding set of images of a surface and the reduced number of astigmatic charged particle beams resulting in a corresponding set of images of the surface, wherein the imaging system is configured so that the set of images that correspond to the reduced number of astigmatic charged particle beams is used to focus the plurality of non-astigmatic charged particle beams.

15. The beam source for an imaging system of claim 14, wherein the dynamic defocus multi-aperture array is provided with a variable potential under control of a controller.

16. The beam source for an imaging system of claim 14, further comprising a shielding aperture located between the dynamic defocus multi-aperture array and the charged particle source, the shielding aperture being maintained at a potential different from that of the dynamic defocus multi-aperture array.

17. The beam source for the imaging system of claim 14, wherein the dynamic defocus multi-aperture array is located between the charged particle beam source and the multi-aperture array and is maintained at a potential different than that of the multi-aperture array.

18. The beam source for the imaging system of claim 14, further comprising a pre-multi-aperture array element positioned between the charged particle source and the dynamic defocus multi-aperture array, the pre-multi-aperture array element comprising apertures that are smaller than corresponding apertures in the multi-aperture array.

19. The beam source for an imaging system of claim 18, further comprising a shielding aperture located between the dynamic defocus multi-aperture array and the pre-multi-aperture array, the shielding aperture being maintained at a potential different from that of the dynamic defocus multi-aperture array.

20. The beam source for an imaging system of claim 18, further comprising a shielding aperture located between the dynamic defocus multi-aperture array and the pre-multi-aperture array, wherein the shielding aperture is maintained at a same potential as at least one of the multi-aperture array or the pre-multi-aperture array.

* * * * *